United States Patent [19]

Windebank

[11] 4,433,294
[45] Feb. 21, 1984

[54] METHOD AND APPARATUS FOR TESTING A BATTERY

[75] Inventor: Robert W. Windebank, Woodbury, Conn.

[73] Assignee: Firing Circuits, Inc., Norwalk, Conn.

[21] Appl. No.: 270,823

[22] Filed: Jun. 5, 1981

[51] Int. Cl.³ .............................................. G01N 27/46
[52] U.S. Cl. .................................. 324/426; 324/429; 324/433; 320/48
[58] Field of Search ............... 324/426, 429, 433, 434, 324/73 AT; 320/27, 32, 48

[56] References Cited

U.S. PATENT DOCUMENTS

| 3,680,072 | 7/1972 | Charbonnier . | |
|---|---|---|---|
| 3,808,487 | 4/1974 | Feuillade . | |
| 3,873,911 | 3/1975 | Champlin . | |
| 3,886,428 | 5/1975 | Macharg | 320/48 |
| 3,886,442 | 5/1975 | Chiku et al. . | |
| 3,997,834 | 12/1976 | Winter et al. | 320/48 |
| 4,044,300 | 8/1977 | Dupuis et al. . | |
| 4,163,194 | 7/1979 | Ross . | |
| 4,204,162 | 5/1980 | Froidevaux . | |
| 4,217,645 | 8/1980 | Barry et al. . | |
| 4,255,698 | 3/1981 | Simon . | |
| 4,258,306 | 3/1981 | Bourke et al. . | |
| 4,259,639 | 3/1981 | Renirie . | |
| 4,260,943 | 4/1981 | Zaderej et al. . | |
| 4,275,351 | 6/1981 | Harer et al. . | |
| 4,290,002 | 9/1981 | Piotti . | |
| 4,290,021 | 9/1981 | Theron et al. . | |
| 4,290,109 | 9/1981 | Taniguchi et al. | 324/429 |
| 4,295,097 | 10/1981 | Thompson et al. . | |
| 4,307,330 | 12/1981 | Belot . | |
| 4,313,078 | 1/1982 | Bilsky et al. . | |
| 4,322,685 | 3/1982 | Frailing et al. | 324/429 |
| 4,377,787 | 3/1983 | Kikuoka et al. . | |
| 4,385,269 | 5/1983 | Aspinwall et al. . | |
| 4,392,101 | 7/1983 | Saar et al. . | |

FOREIGN PATENT DOCUMENTS

| 22450 | 1/1981 | European Pat. Off. . |
|---|---|---|
| 1469849 | 4/1977 | United Kingdom . |
| 2003337 | 3/1979 | United Kingdom . |
| 2008776 | 6/1979 | United Kingdom . |
| 2046923 | 11/1980 | United Kingdom . |
| 2047488 | 11/1980 | United Kingdom . |

OTHER PUBLICATIONS

"Compact Controller Manages Industrial Systems in Real Time", Computer Design, vol. 18, No. 2 (Feb. 1979).
Winter et al., Journal of the Electrochemical Society, pp. 1434–1438.

Primary Examiner—Michael J. Tokar
Assistant Examiner—Kevin D. O'Shea
Attorney, Agent, or Firm—Curtis, Morris & Safford

[57] ABSTRACT

The operating condition and/or characteristics of a battery is tested by obtaining the dynamic voltage-current characteristic of the battery as a function of the charge condition thereof. A controllably varying charging current is supplied to the battery, and the voltage produced across the battery while that current is supplied is measured. The dynamic voltage-current characteristic is obtained as a function of the measured voltage and supplied current. This voltage-current characteristic is compared to predetermined voltage-current characteristics representing batteries of the type being tested in order to determine the operating condition and/or characteristics of the battery under test.

34 Claims, 12 Drawing Figures

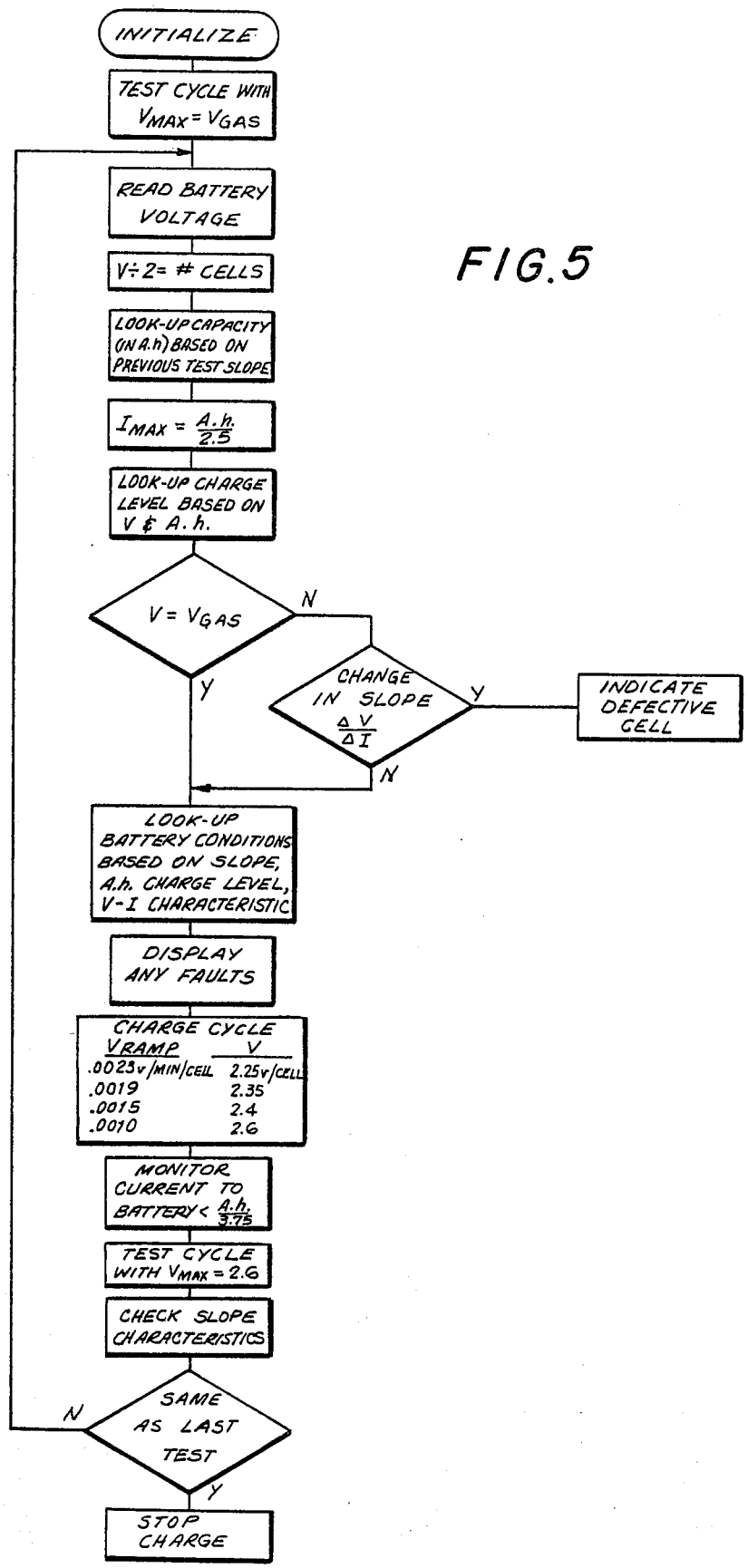

METHOD AND APPARATUS FOR TESTING A BATTERY

BACKGROUND OF THE INVENTION

This invention relates to a method and apparatus for testing a battery, such as an industrial battery, and more particularly, to such a method and apparatus whereby the operating condition and/or characteristics, including possible fault conditions, of the battery is determined.

Often, it is desirable to ascertain whether a battery is defective, or whether it is capable of being charged, or what its charge capacity is, or what its present state-of-charge is. Depending upon these factors, it may be concluded that the battery should be replaced. Also, these factors can be used to establish optimum parameters for charging that battery. For example, in many industrial applications, it is necessary that batteries whose charges have been depleted be quickly re-charged for subsequent re-use. Such industrial-type batteries exhibit high charge capacities, on the order of several hundred ampere-hours (A.H.), and usually are acid-type batteries, such as the conventional lead-acid battery. Desirably, such industrial batteries should be charged by apparatus that is relatively simple to operate.

Some commercially available battery charges employ the so-called constant voltage technique wherein a constant charging voltage is applied across the battery for a pre-set charging duration. However, this technique does not take into account a change in the actual charge capacity of the battery due to repeated charging operations and, thus, becomes less effective as the battery ages. It would be helpful if the battery could be tested to determine the actual charge capacity thereof.

Other commercially available battery charges establish a pre-set charging time which, generally, is unrelated to the actual charge level of the battery. The battery then is charged with a substantially constant charging current which is established by the operator as a function of the rated battery capacity. Since, over a period of time, the actual battery capacity may differ substantially from its rated capacity, the charging current might be too high. Also, if the battery exhibits a relatively low charge level, the charging time duration may be insufficient to charge the battery satisfactorily. It would be advantageous if the charge level, or state-of-charge, of the battery could be determined.

A battery charger has been introduced by Christie Electric Corp., Los Angeles, Calif., wherein the state-of-charge of the battery is measured by, for example, an ammeter, which indicates battery current during interruptions in the charging operation. However, this charger suffers from disadvantages, such as operating over a pre-set charging time duration which may be too short or too long. Also, this charger operates with relatively low capacity batteries.

A battery charger introduced by Westinghouse Davenset Rectifiers of England supplies a charging current to the battery and senses when the battery voltage reaches a predetermined level. This level is assumed to be the gas voltage ($V_{gas}$) level which, as is known, is the battery voltage at which the battery exhibits a "gassing" condition wherein the electrolyte of the battery is subjected to electrolysis to emit gas. In the Westinghouse Davenset Rectifiers battery charger, when the battery voltage reaches the gas voltage level $V_{gas}$, a pre-set timer is triggered to establish the gas period. At the termination of this pre-set gas period, normal charging is terminated; and the battery then is supplied with an equalizing charge followed by a "hold ready" charge which replaces open circuit losses. While this charger includes various features, such as pre-gas charge protection, avoiding the establishment of the gas period if a fully charged or slightly discharged battery is used, charging nevertheless occurs during a pre-set time interval. There is little, if any, correlation between the actual state-of-charge of the battery and the charging duration. The operating condition and/or characteristics of the battery is not tested. Hence, this charger may, undesirably, either over-charge or under-charge a battery connected thereto.

In the battery charger manufactured by Oldham/Harmer & Simmons, of England, a charging current is supplied to the battery, and this current is measured for a brief period of time when the battery voltage reaches its gas voltage level $V_{gas}$. Operation, however, proceeds substantially independently of the actual condition of the battery. The charging current levels are dependent upon the rated battery capacity, which may differ substantially from the actual capacity thereof. Furthermore, the actual battery operating and fault conditions are not sensed automatically or indicated to an operator. Hence, faulty or defective batteries may be charged, with a resultant waste in energy and time. Furthermore, a faulty battery, which may be easily repaired, if not indicated, may be supplied with a charging current that results in permanent damage.

It also has been proposed by the prior art to supply a charging current to a battery, and to interrupt the charging current periodically to measure the battery voltage. This measure of battery voltage is used to indicate whether the battery has reached its gassing level, and the charging current magnitude is reduced when this gassing level is attained. Although the battery voltage is "tested" periodically, such tests are not used to indicate the condition of the battery, nor are the test results used to indicate when the battery has been satisfactorily charged.

The prior art also has proposed a battery test arrangement wherein a current ramp is supplied, resulting in a change in the battery voltage. The voltage-current characteristic for each cell, which is a function of the supplied current and measured voltage, is determined by a computer; and an average voltage-current characteristic is derived from all of the cells. Then, the voltage-current characteristic of each cell is compared to the average voltage-current characteristic, and the battery is rejected if the characteristic of any one cell differs significantly from the average characteristic. However, this arrangement requires direct access to each cell of the battery. In many industrial batteries, such access is difficult, if not impossible. Furthermore, since the battery is "tested" by deriving an average voltage-current characteristic therefrom, a battery which is severely defective will not be detected.

Yet another prior art battery test technique proposes that a voltage-current curve derived from the tested battery be plotted, and that the slope of this curve be compared to an "average" curve which represents average slopes for different battery charge levels. Then, the actual charge level of the battery under test is determined by noting the charge level on this "average" curve corresponding to the measured slope of the test voltage-current curve. This test technique, although helpful in obtaining a measure of the state-of-charge of the battery, nevertheless does not provide indications of various fault conditions which may exist.

Another problem associated with many battery chargers is that the charging current supplied thereby should be matched to the battery which is charged. Typically, it is necessary that the capacity of the battery as well as the number of cells included therein be known in advance, as opposed to being ascertained merely by testing the battery. Furthermore, many of these chargers will attempt to charge a defective battery notwithstanding a serious fault condition which may be present. This can result in damage to the battery as well as produce a hazardous condition.

Therefore, there has been a need for apparatus that is capable of automatically testing the condition of the battery, determining the operating characteristics thereof (e.g. charge capacity, state-of-charge, and the like), and indicating or displaying various fault conditions.

OBJECTS OF THE INVENTION

Therefore, it is an object of the present invention to provide an improved method and apparatus for testing a battery which overcomes the aforenoted disadvantages attending the prior art.

A further object of this invention is to provide a method and apparatus for testing a battery to obtain information relating to that battery, such as number of cells, charge capacity, present state-of-charge, and the like.

An additional object of this invention is to provide a method and apparatus for testing the condition of a battery to detect a possible fault condition.

Yet another object of this invention is to provide a method and apparatus for testing a battery, wherein the results of the battery test can be used to indicate the condition of the battery and to control charging of the battery.

Various other objects, advantages and features of the present invention will become readily apparent from the ensuing detailed description, and the novel features will be particularly pointed out in the appended claims.

SUMMARY OF THE INVENTION

In accordance with this invention, a method and apparatus are provided for testing a battery to ascertain the operating condition and/or characteristics thereof by obtaining the dynamic voltage-current characteristic of the battery as a function of its charge condition.

In accordance with one aspect of this invention, the dynamic voltage-current characteristic of the battery is obtained by supplying a controllably varying charging current, such as an increasing ramp current followed by a decreasing ramp current, to the battery; and measuring the voltage produced across the battery output terminals in response to the charging current supplied thereto while that charging current is being supplied. In a preferred embodiment, a data processor, such as a microprocessor, is used to control the charging current that is supplied to the battery and to obtain the voltage-current characteristic.

In accordance with another aspect of this invention, various conditions of the battery are determined as a function of the dynamic voltage-current characteristic which is obtained. For example, discontinuities in the slope of the voltage-current characteristic occurring at certain voltage levels may indicate a fault condition. As another example, the slope of the voltage-current characteristic may provide a reasonably accurate representation of the actual charge capacity of the battery. As a further example, the so-called open-circuit voltage, that is, the voltage obtained on a voltage-current characteristic when the battery current is substantially equal to zero, provides a reasonably accurate representation of the state-of-charge of the battery.

BRIEF DESCRIPTION OF THE DRAWINGS

The following detailed description, given by way of example, will best be understood in conjunction with the accompanying drawings in which:

FIG. 5 is a flow chart of a general program which can be used by a data processor to carry out a battery test operation and to control a battery charging operation in response to that test operation;

DETAILED DESCRIPTION OF CERTAIN PREFERRED EMBODIMENTS

Figure 1:
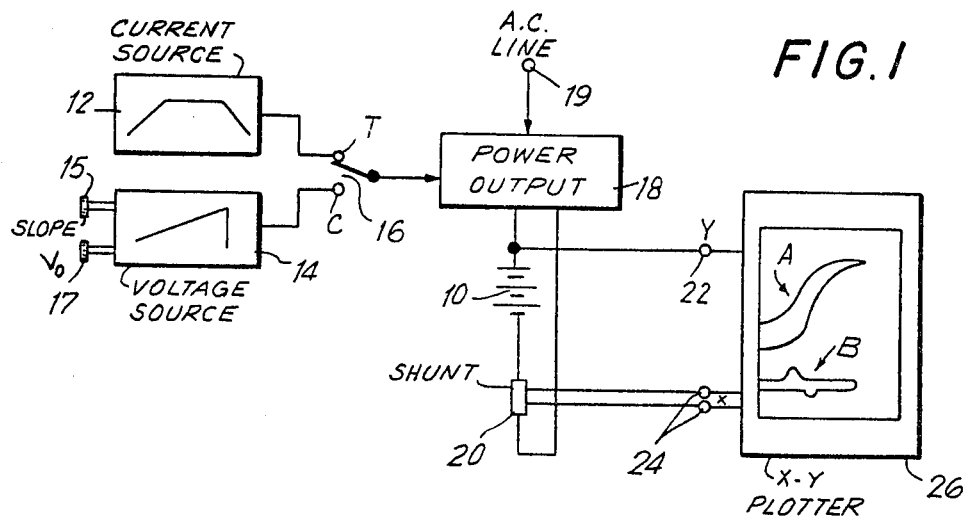
FIG. 1 is a block diagram of apparatus incorporating the present invention.

Referring now to the drawings, wherein like reference numerals are used, FIG. 1 is a block diagram of one embodiment of apparatus which can be used to test and to charge a battery 10. The illustrated apparatus is adapted to test and charge various types of secondary cells; and the following discussion is directed to apparatus which is particularly useful for operating with an acid-type industrial battery, such as a lead acid battery. Preferably, battery 10 is formed of a plurality of cascaded cells, such that the output voltage produced by that battery, that is, the output voltage which appears across the battery terminals, is a function of the number of cells included therein. Typically, each cell produces a voltage on the order of about 2 volts, the actual cell voltage being a function of its state-of-charge. As a numerical example, a "normal" fully-charged battery produces an output voltage of about 2.2 volts. This cell voltage is less for lesser states-of-charge. Accordingly, for a 6-cell battery, the output battery voltage normally can be expected to range between 12.0 volts and 13.2 volts, with the actual battery voltage being a function of the charge condition thereof.

Figure 4:
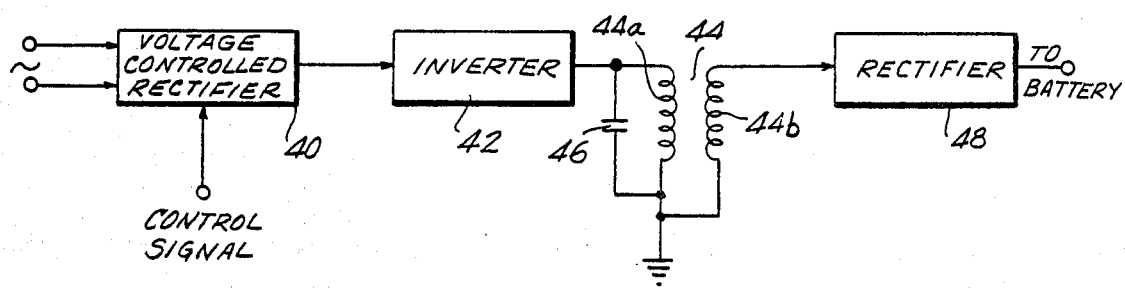
FIG. 4 is a block diagram of a portion of the apparatus shown in FIG. 3.

The apparatus illustrated in FIG. 1 is comprised of a variable current source 12, a voltage source 14, a selector switch 16, a power output circuit 18 and a graphical X-Y plotter 26. Battery 10 is connected in series with power output circuit 18 and is adapted to be supplied with energy therefrom. As will be explained, power output circuit 18 is selectively controlled such that this energy may be considered to be a charging current during one mode of operation and a charging voltage during another mode of operation. In order to supply the requisite high current levels to battery 10, power output circuit 18 is coupled to an AC power supply line 19, such as 110/220 volt 60 Hz mains. One embodiment of power output circuit 18 is described in greater detail hereinbelow with respect to FIG. 4. It will be appreciated that, under suitable control, the power output circuit converts the AC power supplied thereto from AC line 19 to a controlled DC current or DC voltage which, in turn, is supplied to charge battery 10.

A shunt element 20, such as a high-current, low-resistance resistor, is connected in series between battery 10 and power output circuit 18. The purpose of shunt element 20 is to produce a voltage thereacross which is directly related to the DC current supplied to the battery. This voltage representation of the battery current is referred to herein merely as a measure of the battery current and is utilized in a manner described more fully below.

Power output circuit 18 is controlled by a current control signal or by a voltage control signal selectively supplied thereto via switch 16. This switch is utilized as a test/charge switch and is depicted as an electromechanical switch having a movable element selectively engaged with either a test contact T or a charge contact C. Test contact T is coupled to the output of variable current source 12, and charge contact C is coupled to the output of voltage source 14.

Variable current source 12 is adapted to generate a current control signal which gradually varies with respect to time. In one embodiment, variable current source 12 serves to generate a triangular current control signal having a gradually increasing portion followed by a gradually decreasing portion. This current control signal, when supplied to power output circuit 18, controls the latter to supply a corresponding charging current to battery 10. Preferably, variable current source 12 functions to generate a trapezoidal-shaped current control signal having a gradually increasing portion, followed by a substantially constant current level portion, followed by a gradually decreasing portion, as illustrated in FIG. 1. The increasing, or positive ramp, portion of the current control signal preferably increases linearly with respect to time so as to produce a charging current which likewise increases linearly from an initial zero level to a maximum current level. This maximum current level is set as a function of the actual charge capacity of battery 10, for example, the maximum current level is equal to the charge capacity of the battery divided by the factor 2.5. The decreasing, or negative ramp, portion of the current control signal preferably varies linearly with respect to time so as to produce a corresponding charging current whose slope is equal to but opposite that of the positive ramp portion. For example, if battery 10 has a capacity of 800 ampere-hours, the maximum charging current is on the order of about 320 amps, and the slope of the positive and negative ramp portions thereof is on the order of about 100 amps/sec. Preferably, this slope remains constant regardless of the maximum current level which is attained by the charging current, that is, this slope remains constant regardless of the actual capacity of battery 10. Of course, other slopes may be selected, as desired.

Preferably, switch 16 remains engaged with its test contact T for a predetermined duration, referred to herein as the test cycle. During this test cycle, variable current source 12 supplies the aforedescribed current control signal to power output circuit 18, resulting in a "test" charge current supplied to battery 10 during this test cycle. It is appreciated that, if the duration of the test cycle is fixed, and if the slopes of the positive and negative ramp portions of the current control signal likewise are fixed, then the time interval during which the constant current level is supplied to battery 10 is a function of the maximum charging current level attained during the positive ramp portion of the control current signal. That is, since the charging current will reach a lower maximum current level in a shorter period of time, the time duration of the constant current level is relatively greater. Alternatively, the duration of the constant current level may remain fixed such that the overall time duration of the test cycle is variable. In this alternative embodiment, the test cycle duration is shorter if the maximum current level to which the charging current may rise is less. For example, if it is established that the test cycle duration remains fixed at 8 seconds, and if the maximum charging current level is set at 300 amps, then the positive ramp portion of the current control signal extends for about 3 seconds, followed by a constant current control signal level that extends for about 2 seconds, followed by the negative ramp portion of the current control signal which extends for about 3 seconds. For this same 8 second test cycle duration, if the maximum charging current level is set at 350 amps, then the positive ramp portion extends for about 3.5 seconds, followed by the constant current level portion which extends for about 1.0 seconds, followed by the negative ramp portion which extends for about 3.5 seconds. In the alternative embodiment, if the constant charging current level is to extend for about 2 seconds, then, for a maximum charging current level of 300 amps, the positive ramp portion extends for about 3 seconds, followed by the 2 second constant current level portion, followed by the negative ramp portion which extends for about 3 seconds, resulting in an overall test cycle of about 8 seconds. However, if the maximum charging current level is established to be about 350 amps, then it is appreciated that the overall test cycle duration extends for about 9 seconds.

As will be described below, during the test cycle duration, various conditions and characteristics of battery 10 are measured and determined. Following the test cycle, switch 16 is changed over so as to engage its charge contact C. Then, a charge cycle is carried out. During this charge cycle, power output circuit 18 is controlled by voltage source 14 to supply battery 10 with a controllable charging voltage.

Voltage source 14 is adapted to generate a voltage control signal which is substantially ramp-shaped. The voltage source is provided with manually operable adjustments, such as adjustment knobs 15 and 17, adapted to adjust, or change, the slope and initial voltage level $V_o$, respectively, of the ramp-shaped voltage control signal. Advantageously, the slope of this voltage ramp is adjustable so as to be related to the state-of-charge of battery 10. More particularly, during the test cycle, the battery voltage which is produced in response to the test charging current supplied thereto generally will be dependent upon the state-of-charge of the battery, and the slope of the voltage ramp generated by voltage source 14 is related to this voltage. It may be appreciated that, if the state-of-charge of battery 10 increases, the battery voltage produced in response to the test charging current supplied thereto likewise will increase.

Preferably, as this battery voltage reaches certain predetermined levels, the slope of the voltage ramp generated by voltage source 14 will vary. Preferably, slope adjustment knob 15 is provided such that an operator may reduce the slope of the voltage ramp when the battery voltage, which is measured during each test cycle, exceeds predetermined levels. As a numerical example, if battery 10 exhibits a relatively low initial state-of-charge, then slope adjustment knob 15 may be set such that the voltage ramp generated by voltage source 14 results in a corresponding ramp-shaped charging voltage having a slope equal to 0.0023 volts/-min./cell. When, during a succeeding test cycle, the battery voltage increases, as a result of preceding charging cycles, so as to reach a level of 2.25 volts/cell during a test cycle, the slope of the ramp-shaped charging voltage supplied to battery 10 is reduced to 0.0019 volts/min./cell. This reduction may be attained by appropriately setting slope adjustment knob 15. Subsequently, during a test cycle, if the battery voltage is measure to be about 2.35 volts/cell, the slope of the ramp-shaped charging voltage is reduced further to, for example, 0.0015 volts/min./cell. Further reductions in the slope of the charging voltage may be made, as desired, when the battery voltage, during succeeding test cycles, exceeds other threshold levels.

Although not shown herein, suitable "start" switches may be provided so as to actuate variable current source 12 when switch 16 is changed over to engage its test contact T, and to actuate voltage source 14 when the switch is changed over to engage its charge contact C. Switch 16 may be manually changed over from one contact to another or, alternatively, a timer may be provided to effect this change over. As mentioned above, each test cycle may be fixed for a duration of about 8 seconds or, alternatively, the test cycle may be variable with a maximum duration on the order of about 10 seconds. Each charge cycle may be fixed and may exhibit a duration on the order of about 10 to 20 minutes.

The operation of the apparatus illustrated in FIG. 1 now will be described. When a test cycle is initiated, as when switch 16 engages its test contact T, variable current source 12 supplies the aforedescribed varying current control signal to power output circuit 18, whereby the power output circuit supplies a corresponding controllably varying test charging current to battery 10. For convenience, the current supplied by power output circuit 18 to the battery during the test cycle is referred to herein as the test current. As discussed previously, it is preferred that this test current be substantially trapezoidal shaped, although a triangular shaped test current may be supplied. As alternative modifications, the test current may be sinusoidally shaped, and still other wave shapes may be utilized. Regardless of the particular shape of the test current, it is important merely that the test current increase with respect to time and then decrease with respect to time.

As the test current is supplied to battery 10, a corresponding voltage is produced across shunt element 20. This voltage, which is a direct representation of the magnitude of the test current supplied to battery 10, is applied to input terminals 24 of X-Y plotter 26. This plotter may be a conventional two-coordinate ink plotter whose abscissa is supplied with a voltage measurement representing the test current through battery 10. X-Y plotter 26 includes another input terminal 22 coupled across battery 10 and adapted to receive the actual battery output voltage which is produced in response to the test current supplied thereto. If the current measurement supplied to input terminals 24 of plotter 26 is used to determine the abscissa of each two-coordinate graphical plot, then the voltage measurement supplied to input terminal 22 of the plotter is adapted to control the ordinate of that plot. Thus, plotter 26 generates a graphical characteristic whose X-axis is a function of battery test current and whose Y-axis is a function of battery voltage. The resultant X-Y plot is a voltage-current (V-I) characteristic of battery 10 during a test cycle. This V-I characteristic is illustrated in FIG. 1 as curve A.

Circuitry may be coupled to X-Y plotter 26 to obtain the derivative, or time-differential, of V-I characteristic A. This derivative characteristic is graphically drawn by the X-Y plotter. In FIG. 1, curve B represents the time-derivative of V-I characteristic A.

Figure 2A:
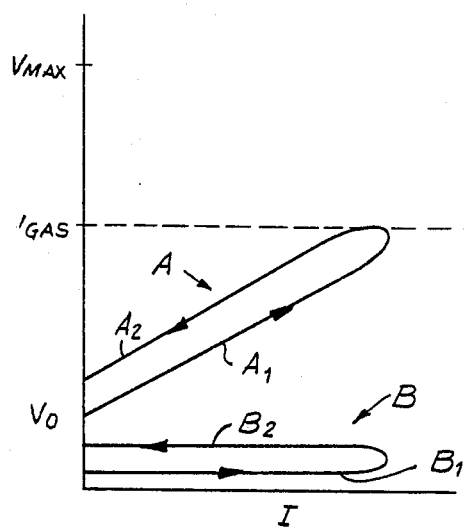
FIGS. 2A–2D are graphical representations of the voltage-current characteristics, shown as loops, which are obtained for a battery being charged to different states-of-charge.

Before describing the operation of the apparatus shown in FIG. 1 during a charge cycle, further description is provided with respect to the V-I characteristics which are obtained during various test cycles of battery 10. Referring now to FIG. 2A, let it be assumed that battery 10 exhibits a relatively low initial state-of-charge. Accordingly, when the test current described above is supplied to the battery during an initial test cycle, for example, when a triangular-shaped or trapezoidal-shaped test current is supplied, the resultant voltage-current characteristic that is obtained while the test current is supplied is illustrated by curve A shown in FIG. 2A. If the capacity of the battery is not known, and if the number of cells included in that battery also is not known, then the maximum current level, or "peak" of the test current supplied to battery 10, may be established initially at a relatively low level so that the voltage produced across battery 10 in response thereto remains below the gas voltage level $V_{gas}$, such as a test current peak level on the order of about 200 amps. As mentioned above, the gas voltage $V_{gas}$ is the battery voltage at which the battery exhibits a "gassing" condition, wherein the electrolyte is subjected to electrolysis so as to emit gas. For most lead-acid batteries, the gas voltage level is about 2.3 volts/cell. It is seen that the voltage-current characteristic $A_1$ which is obtained during the positive ramp portion of the test current is not identical to the voltage-current characteristic $A_2$ which is obtained during the negative ramp portion of the test current. That is, the voltage-current characteristic exhibits hysteresis. One possible explanation of this hysteresis may be that, even though the test current is supplied for only a relatively brief time interval, this test current may be sufficient to alter the electro-chemical characteristics of the battery, thereby modifying the dynamic voltage-current characteristic thereof. FIG. 2A also illustrates the derivative of voltage-current characteristic A, this derivative curve being illustrated as curve B. More particularly, derivative curve $B_1$ corresponds to the derivative of voltage-current characteristic $A_1$, obtained during the positive ramp portion of the test current; and derivative curve $B_2$ corresponds to voltage-current characteristic $A_2$ which is obtained during the negative ramp portion of the test current.

The slope of the dynamic voltage-current characteristic A is a function of the actual charge capacity of battery 10. For a particular battery, although the state-of-charge thereof may vary, such as when the battery is charged, thereby changing the dynamic voltage-current characteristic thereof, the slope of that dynamic voltage-current characteristic nevertheless remains substantially constant. However, if the actual charge capacity of that same battery changes, such as if the battery had not been charged to its proper level during many charging operations, or due to a change in the electro-chemical characteristic thereof, the slope of the dynamic voltage-current characteristic will change. The slope of the dynamic voltage-current characteristic is inversely related to the charge capacity of the battery. Hence, for batteries having higher charge capacities, the slopes of the dynamic voltage-current characteristics obtained for such batteries are relatively lower. That is, for such batteries, V-I characteristic curve A will be less steep. Charts, or plots, of typical voltage-current characteristic curves for batteries having different charge capacities may be prepared, and the actual dynamic voltage-current characteristic which is obtained for a battery under test then may be compared to one of these plots in order to determine the actual capacity of that battery. Alternatively, a table, such as a "look-up" table, which correlates different battery charge capacities and V-I slopes may be prepared and utilized to determine the particular charge capacity of the battery under test.

From FIG. 2A, it is seen that the open-circuit voltage of battery 10, that is, the voltage which is produced in response to a test current of zero amps, is equal to $V_o$. From observation, it has been found that the number of cells N included in the battery under test may be approximated by dividing the initial open-circuit voltage by the factor 2. Thus, $N = V_o/2$. Typical open-circuit voltages for conventional lead-acid batteries range between 1.8 volts/cell to 2.2 volts/cell. Hence, for a conventional 6-cell lead-acid battery, the initial open-circuit voltage $V_o$ may be expected to be within the range of 10.8 volts to 13.2 volts.

Various battery conditions may be determined from the dynamic voltage-current characteristic which is obtained during a test cycle of battery 10. For example, for a battery having a predetermined number N of cells, the initial open-circuit voltage $V_o$ may be expected to be within a particular range. If the actual open-circuit voltage is below that range, it may be concluded that the battery is drastically under-charged, or that a fault condition is present. That is, the battery may be defective. Also, for a battery having N cells and a particular initial open-circuit voltage $V_o$, the actual charge capacity thereof may be expected to be within a predetermined range. However, if the slope of the dynamic voltage-current characteristic which is obtained is too high or too low, it may be concluded that the actual charge capacity, which is related to that slope, falls without the predetermined range, thereby indicating the possibility of a defect.

As yet another example of battery conditions which can be determined, if a relatively low initial open-circuit voltage $V_o$ is measured, thus representing a relatively low initial state-of-charge, the dynamic voltage-current characteristic A should be substantially free of abrupt changes, or discontinuities. Although such discontinuities are expected as the state-of-charge of the battery increases, as will be described, the presence of such discontinuities in the V-I characteristic at low states-of-charge may be indicative of a defect. For example, one or more cells of the battery may contain broken plates or low levels of electrolyte. These defective conditions are indicated by a disturbance in the V-I characteristic at voltage levels less than a predetermined threshold, for example, at voltage levels less than the gas voltage level $V_{gas}$. For most lead-acid batteries, the gas voltage level $V_{gas}$ is equal to 2.35 volts/cell.

Yet another indication of a possibly defective condition of battery 10 is the amount of hysteresis that is present in the dynamic voltage-current characteristic A. For most lead-acid batteries having N cells, it is expected that a significant amount of hysteresis will be present. Examples of such hysteresis may be obtained by plotting "reference" dynamic voltage-current characteristics obtained for various different batteries. If the actual hysteresis of the dynamic voltage-current characteristic obtained from a battery under test is far less than the expected hysteresis thereof, it is possible that the tested battery may be defective. This may be determined by comparing the actual voltage-current characteristic to such reference characteristics. Alternatively, insufficient hysteresis, indicative of a defective condition, may be determined if the open-circuit voltage which is produced when the test current returns to zero is equal to or almost equal to the open-circuit voltage which is produced when the test current initially is zero.

Figure 2B:
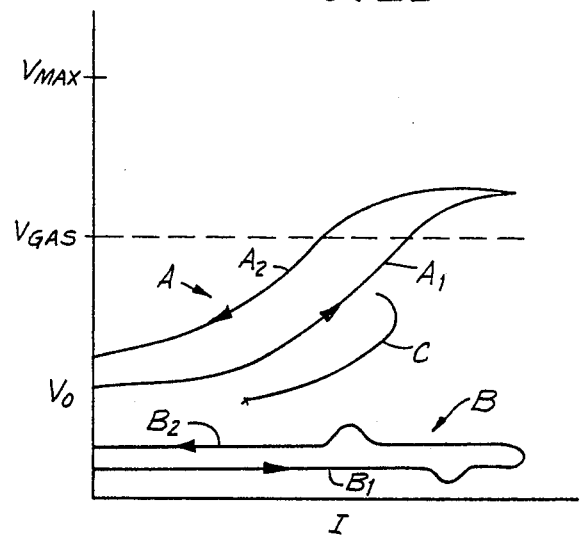

If the battery under test is subjected to a charging operation, as will be described, or if the initial state-of-charge thereof is higher than that which has been described for the battery which yields the V-I characteristic shown in FIG. 2A, the dynamic voltage-current characteristic which is obtained may appear as shown in FIG. 2B. A comparison of the V-I characteristics of FIGS. 2A and 2B indicates that, in the battery which exhibits a higher state-of-charge (whose V-I characteristic is shown in FIG. 2B), the initial open-circuit voltage $V_o$ is higher. Also, the hysteresis between V-I characteristic $A_1$, obtained during the positive ramp portion of the test current, and V-I characteristic $A_2$, obtained during the negative ramp portion of the test current, has increased. Still further, curves $A_1$ and $A_2$ no longer exhibit substantially constant slope. Rather, the slope of curve $A_1$ is seen to increase when a first test current level is reached, and then this slope decreases abruptly when a second, higher test current level is reached. During the negative ramp portion of the test current, it is seen that the slope of curve $A_2$ increases abruptly when the test current is reduced from its maximum level and then, subsequently, the slope gradually decreases. The derivative B of this dynamic voltage-current characteristic A clearly shows the abrupt changes in the slopes of curves $A_1$ and $A_2$. In particular, derivative curve $B_1$ illustrates an abrupt reduction in the slope of curve $A_1$; and derivative curve $B_2$ illustrates an abrupt increase in the slope of curve $A_2$. These abrupt changes, or discontinuities, in the slope of the dynamic voltage-current characteristic A occur at relatively higher test current levels.

FIG. 2B also illustrates that the battery voltage which is produced in response to the test current supplied thereto exceeds the gas voltage level $V_{gas}$ when the test current reaches a corresponding threshold level. It is expected that the gas voltage level $V_{gas}$ will be exceeded in response to the test current if the state-of-charge of the battery is greater than a predetermined amount, this predetermined charge level being represented by the open-circuit battery voltage $V_o$. If, however, the battery voltage does not exceed the gas voltage level $V_{gas}$ for this state-of-charge, it may be interpreted that the battery under test is defective. Also, for this state-of-charge, if the battery voltage which is produced in response to the maximum test current supplied thereto greatly exceeds the gas voltage level $V_{gas}$, or is approximately equal to a maximum voltage level $V_{max}$, a fault condition may be present. Hence, the battery condition may be determined by observing the dynamic voltage-current characteristic which is obtained and by comparing the resultant V-I characteristic with reference characteristics. Such reference characteristics may be prepared, in advance, by testing known, "good" batteries at different states-of-charge.

Although the charge condition (i.e. state-of-charge) of battery 10 may have increased, as represented by the plot shown in FIG. 2B relative to the plot shown in FIG. 2A, the "mean" slope of the dynamic voltage-current characteristic shown in FIG. 2B remains approximately equal to that shown in FIG. 2A. This means that the actual charge capacity of the battery has not varied. It may be appreciated that, if the slope of the dynamic voltage-current characteristic changes significantly, for example, if the slope changes as the battery is charged, such a significant change in slope may be representative of a possibly faulty, or defective, condition.

Figure 2C:
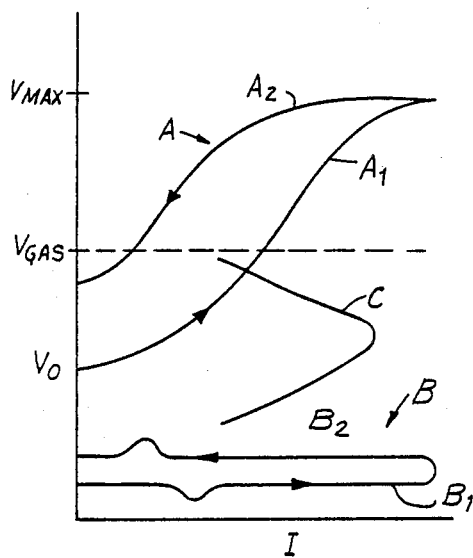
Figure 2D:
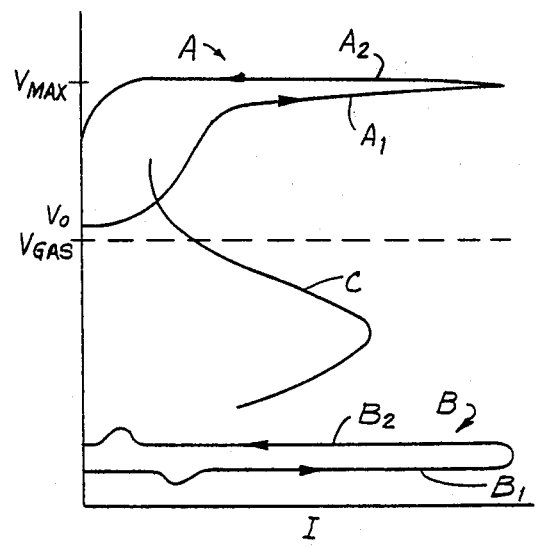

FIGS. 2C and 2D are dynamic voltage-current characteristics which are obtained either for the same battery whose state-of-charge has increased, as by subjecting that battery to charging operations, to be described, or such figures may represent the voltage-current characteristics which are obtained for batteries having different, higher initial states-of-charge. From FIG. 2C, it is seen that the general shape of the dynamic voltage-current characteristic A is similar to the general shape of the dynamic voltage-current characteristic shown in FIG. 2B. In FIG. 2C, the amount of hysteresis exhibited by the V-I characteristic is greater. Also, the open-circuit voltage $V_o$ in FIG. 2C is greater than that shown in FIG. 2B. Hence, the stage-of-charge of the battery whose V-I characteristic is represented in FIG. 2C is greater than the state-of-charge of the battery whose V-I characteristic is illustrated in FIG. 2B. Also, in FIG. 2C, the slope of curve $A_1$, obtained in response to the positive ramp portion of the test current, is seen to gradually increase and then, at a test current level which is less than the test current level of FIG. 2B, abruptly decreases. Similarly, the slope of curve $A_2$ in FIG. 2C is seen to abruptly increase at a test current level which is lower than the test current level which produces the abrupt increase in slope in FIG. 2B. Derivative curve B in FIG. 2C illustrates the locations (i.e. test current levels) at which such abrupt changes in slope occur. A comparison of FIGS. 2B and 2C indicates that, as the charge level of the battery increases, the aforementioned abrupt changes in slope of the dynamic voltage-current characteristic occur in response to lower test current levels.

FIG. 2C also illustrates that the battery voltage quickly exceeds the gas voltage level $V_{gas}$ in response to the triangular or trapezoidal test current supplied to battery 10. The maximum voltage produced in response to this test current now asymptotically approaches the maximum voltage $V_{max}$. From FIG. 2B, it is seen that, when battery 10 exhibits a lower charge level (or state-of-charge), the maximum battery voltage which is produced in response to the test current is substantially less than the maximum voltage level $V_{max}$. For most lead-acid batteries, the maximum voltage which can be produced in response to the aforedescribed test current is on the order of about 2.58 volts/cell. For example, for a 6-cell lead-acid battery, the maximum battery voltage which is produced in response to the test current is equal to about 15.5 volts. If the dynamic voltage-curent characteristic which is obtained from a battery under test exceeds this maximum voltage level, the battery possibly may be defective.

The "mean" slope of the V-I characteristic A shown in FIG. 2C is approximately equal to the "mean" slope of the V-I characteristics shown in FIGS. 2A and 2B. This indicates that the actual charge capacity of the battery remains the same, even though the state-of-charge thereof has increased. If the "mean" slope varies substantially, this may be indicative of a possibly faulty condition in battery 10.

In FIG. 2D, the dynamic voltage-current characteristic for a substantially fully-charged battery is illustrated. The derivative curve B also is illustrated. It is seen from this derivative curve that, during the positive ramp portion of the test current, an abrupt decrease in slope of the dynamic voltage-current characteristic occurs at a much lower test current level than occurs for batteries of lesser charge. Likewise, derivative curve B illustrates an abrupt increase in the slope of the dynamic voltage-current characteristic during the negative ramp portion of the test current, which abrupt increase occurs at a lower test current level. FIG. 2D also indicates that the open-circuit battery voltage $V_o$ exceeds the gas voltage level $V_{gas}$; and the maximum voltage produced by the battery in response to the test current asymptotically approaches the maximum threshold level $V_{max}$ in response to lower test current levels. Still further, the hysteresis between curves $A_1$ and $A_2$ is greater for the battery which is more fully charged. Stated otherwise, the dynamic voltage-current characteristic of FIG. 2D appears "fatter" than the dynamic V-I characteristic curves shown in FIGS. 2A-2C.

From the derivative curves B shown in FIGS. 2A-2D, it may be seen that, as the state-of-charge of the battery increases, the aforementioned abrupt changes, or discontinuities, in the slopes of the dynamic voltage-current characteristics occur at lower test current levels. That is, such discontinuities occur in the derivative curve B closer to the ordinate. This may be turned to account to indicate when battery 10 has been charged to its proper, fully-charged level. For example, from observation, it may be determined that, when battery 10 is fully charged, the abrupt discontinuities present in the derivative curve B occur at predetermined test current levels. If, during a test cycle of battery 10, the derivative curve B is obtained having discontinuities which occur at the same predetermined test current levels, it may be concluded that battery 10 is fully charged.

Returning now to FIG. 1, it now is appreciated that, after an initial test cycle, various conditions and characteristics of battery 10 may be determined. For example, depending upon the slope of the dynamic voltage-current characteristic which is obtained, the actual charge capacity of that battery may be determined. Likewise, depending upon the initial open-circuit voltage $V_o$, the state-of-charge of that battery may be determined. If the dynamic voltage-current characteristic which is obtained differs substantially from the representative voltage-current characteristics shown in FIGS. 2A–2D, it may be concluded that a possible defect or fault is present. If the dynamic voltage-current characteristic which is obtained undergoes abrupt changes, or discontinuities, at locations where such abrupt changes or discontinuities are not expected, for example, at locations well below the gassing level, such abrupt changes or discontinuities may be indicative of a fault condition. Likewise, various other characteristic conditions may be determined by comparing the actual dynamic voltage-current characteristic which is obtained to representative V-I characteristics, or "signatures" which are obtained from known batteries having certain predetermined faults.

After a test cycle having a predetermined short duration, as described above, is carried out, switch 16 is changed over to engage charge contact C. Now, a charge cycle is carried out. In the charge cycle, the ramp control voltage signal is generated and supplied to power output circuit 18, whereupon a corresponding ramp-shaped charging voltage is applied to battery 10. It is important to note that, although a controlled charging voltage is supplied to the battery, the current drawn by that battery in response to this voltage is not controlled. Preferably, the current drawn by the battery is monitored to make sure that it does not exceed a predetermined maximum current level, thereby avoiding a potentially harmful condition and preventing damage to the battery. As mentioned above, the charge cycle is carried out for a time interval on the order of about 10 to 20 minutes. During this charge cycle duration, the slope and initial charge voltage level are controlled. The slope is controlled in accordance with the following table:

TABLE I

| Slope (volts per minute per cell) | | Battery Voltage (volts per cell) |
| --- | --- | --- |
| 0.0023 | until | 2.25 |
| 0.0019 | " | 2.35 |
| 0.0015 | " | 2.4 |
| 0.0010 | " | 2.6 |

It will be appreciated that the charging voltage is terminated if the battery voltage reaches 2.6 volts per cell. That is, if the battery voltage exceeds the maximum threshold level $V_{max}$, the charging operation is terminated. This prevents damage to the battery.

In one embodiment, the ramp charging voltage is of positive slope whose initial voltage is related to the open-circuit voltage $V_o$ which is measured during an immediately preceding test cycle. For example, the ramp charging voltage may commence at a level which is on the order of about 0.1 to 0.6 volts greater than the measured open-circuit voltage $V_o$. In an alternative embodiment, the ramp charging voltage commences at a predetermined higher level and exhibits negative slope so as to decrease toward a final voltage related to the open-circuit voltage $V_o$.

Switch 16 is changed over between its test contact T and its charge contact C periodically so as to carry out repeated, alternate test and charge cycles. Each test cycle is conducted in the manner described hereinabove; and during each test cycle, the dynamic voltage-current characteristic of battery 10 is measured. During each charge cycle, which is seen to be carried out over a much greater time duration than each test cycle, the slope of the ramp voltage is controlled in accordance with Table I. Thus, as the state-of-charge of battery 10 increases, the slope of the ramp voltage decreases as higher battery voltages are measured. Desirably, battery 10 is charged quickly to its gassing level. Hence, the slope of the ramp charging voltage is steeper for battery voltages which are less than the gas voltage level $V_{gas}$. When the gas voltage level is reached, the slope of the ramp charging voltage is reduced; as by operating slope adjustment knob 15, and the slope is further reduced when the predetermined battery voltage levels set out in Table I are reached.

It will be appreciated that, during each subsequent charge cycle, the charge level, or state-of-charge of battery 10 increases. Consequently, during each test cycle following a charge cycle, the dynamic voltage-current characteristic which is obtained will exhibit a progressively changing shape and attitude, as depicted by the selected V-I characteristics of FIGS. 2A-2D. Ultimately, the condition of the battery which is measured during a test cycle will be substantially identical to the condition thereof which has been measured during a preceding test cycle. Stated otherwise, the dynamic voltage-current characteristic which is obtained during a particular test cycle will be substantially identical to the preceding dynamic voltage-current characteristic. This means that there has been no change in the charge condition, or state-of-charge of battery 10. Since this no-change condition will occur substantially only when the battery is fully charged, it now is determined that battery 10 has been charged to its proper, full level.

As an example of detecting when battery 10 has been fully charged, the dynamic voltage-current characteristic A shown, for example, in FIG. 2D, will be substantially congruent with a preceding voltage-current characteristic. As another example, the discontinuities in derivative curve B will occur at substantially the same test current levels as during a preceding test cycle. Still further, if the test current levels are measured, or detected, when derivative curve B undergoes the illustrated discontinuities, then, as battery 10 is charged, such discontinuities will occur at lower and lower test current levels. When such test current levels at which these discontinuities occur are not reduced further, then it is determined that battery 10 has been fully charged. Thus, by comparing the results which are obtained during a test cycle to the results which are obtained during a preceding test cycle, it can be determined when the battery has been fully charged. At that time, charging of the battery is terminated. That is, no further charge cycles need be carried out. If desired, however, further test cycles may be conducted so as to continue to monitor the condition of battery 10.

FIGS. 2B-2D illustrate an additional curve C. This curve C represents the current which flows to battery 10 in response to the ramp charging voltage supplied thereto during each charge cycle. As mentioned above, the current supplied to battery 10 during a charge cycle is not controlled. That is, the current dran by the battery is not limited. Hence, battery 10 draws such current as is determined by the charging voltage supplied thereto, the internal impedance of the battery and the so-called $I^2R$ losses therein. From curves C, it is seen that, as the charging voltage level increases, the current drawn by battery 10 likewise increases. This current-voltage relationship remains substantially linear until the charging voltage level reaches the gas voltage $V_{gas}$. At that time, the effective internal impedance of the battery increases such that the current now drawn thereby decreases even as the charging voltage level continues to increase. Curves C represent this decrease in current, even though the charging voltage increases, following the onset of the gassing condition. from FIG. 2D, it is further seen that the current drawn by the battery continues to decrease until a substantially constant current is drawn regardless of further increases in the charging voltage level. This condition, wherein the battery current no longer decreases with voltage, is attained when the battery is fully charged. Hence, another technique by which it may be determined when battery 10 has been fully charged may comprise the monitoring of the battery current drawn during each charge cycle and detecting when this battery current no longer decreases with an increase in charging voltage. When that point is detected, it may be considered that battery 10 has been fully charged.

From the foregoing, it is appreciated that the charge condition of battery 10 is determined as a function of the dynamic voltage-current characteristic A which is obtained during each test cycle. Although the gas voltage level $V_{gas}$ is substantially the same for most lead-acid batteries, a "look-up" table may be provided which correlates charge capacity and state-of-charge with gas voltage. Since the slope of the dynamic voltage-current characteristic can be measured so as to derive the actual charge capacity, and since the open circuit voltage $V_o$ can be measured so as to derive an approximation of the state-of-charge of the battery, the gas voltage level $V_{gas}$ may be determined for the particular battery then being tested. If discontinuities in the slope of the voltage-current characteristic, such as the discontinuities illustrated for derivative curves B, are detected before the battery voltage reaches the gas voltage level $V_{gas}$, it may be considered that the battery under test is defective. Likewise, if such discontinuities are not sensed even after the battery voltage exceeds the gas voltage level, it may be considered that an improper or unusual condition is present. Such conditions may be displayed by automatic sensing and display apparatus, described in greater detail hereinbelow.

As an alternative to the aforementioned "look-up" table which correlates the gas voltage levels, charge capacities and states-of-charge for different batteries, the gas voltage level of the battery being tested may be determined by sensing the aforementioned discontinuities in the voltage-current characteristic. It may be assumed that, if the state-of-charge of the battery, as derived from the open-circuit voltage $V_o$, exceeds a predetermined charge-level threshold, then such discontinuities in the voltage-current characteristic will occur when the gas level of the battery is exceeded. However, if such discontinuities are detected when the charge-level of the battery is less than the aforementioned predetermined level, then it may be considered that a fault condition is present. Hence, the occurrence of such discontinuities may be used to determine when the battery has been charged to its gassing condition. In addition, and as has been described above, if the current drawn by the battery during each charge cycle thereof is monitored, the gassing condition may be determined by sensing when this monitored current begins to decrease. Curves C, as shown in FIGS. 2B-2D, represent this relationship between the ramp charging voltage and the battery current for different states-of-charge.

Although not shown in FIG. 1, the current drawn by battery 10 during each charge cycle thereof may be monitored. If, during a charge cycle, this monitored current exceeds a predetermined maximum current level, the magnitude of the charging voltage may be reduced. This avoids a potentially dangerous condition which, if not corrected, will result in damage to the battery. The maximum current level which should not be surpassed preferably is a function of the charge capacity of battery 10. As discussed above, the charge capacity of the battery is related to the slope of the dynamic voltage-current characteristic A thereof. As a numerical example, the maximum battery current during the charge cycle may be derived by dividing this actual charge capacity by the factor 3.75. Consequently, for batteries which exhibit relatively higher charge capacities, the maximum currents which may be drawn during each charge cycle may be substantially higher than the maximum currents which may be drawn for batteries having lower charge capacities.

In the foregoing discussion, it is preferred that the test current supplied to battery 10 by power output circuit 18 in response to variable current source 12 be either a triangular-shaped test current or a trapezoidal-shaped test current. Advantageously, if a trapezoidal-shaped test current is used, an "equalizing" charge need not be supplied after the charging operation is completed. This is because the relatively high current level of the constant current portion which follows the positive ramp and precedes the negative ramp of the test current achieves a function which obviates such an equalizing charge.

When a lead-acid battery is charged, the electrolyte therein may exhibit some degree of stratification. Such stratified acid tends to reduce the charge capacity of the battery and, moreover, results in a reduction in the state-of-charge thereof. To avoid such stratification, it is desirable to "stir" the acid, as by inducing bubbles therein. Such stirring, or mixing of the acid makes the characteristics of the battery more uniform and brings the battery closer to its rated capacity and output levels. Although this is one purpose of supplying an equalizing charge to a battery, conventional battery chargers require a number of hours for supplying low equalizing charging currents to the battery. However, such low charging currents induce relatively small bubbles in the acid which may not be strong enough to effect proper mixing of the acid. Contrary to such conventional chargers, the trapezoidal-shaped test current which is used during the test cycle of the present invention supplies a very high substantially constant test current level to the battery during short time intervals. Such high current levels induce large bubbles in the acid, resulting in desirable, enhanced mixing. Since the duration of such high test current levels is relatively brief, battery damage is avoided.

While such "stirring" may be carried out during each periodic test cycle, in an alternative embodiment, such stirring is carried out only during selected test cycles. Consequently, during those test cycles wherein stirring need not be performed, the test current may be triangular shaped.

The embodiment shown in FIG. 1 is particularly adapted to operate in test and charge cycles, alternately. If battery 10 merely is to be tested to determine its operating condition, or characteristics thereof, or a possible defect therein, as aforedescribed, change over switch 16 and voltage source 14 may be omitted. Hence, only current source 12 is coupled to power output circuit 18, and the test operation described above may be carried out. This test operation may be repeated, as desired, so that the condition and/or characteristics of an unknown battery can be readily and quickly ascertained.

Figure 3:
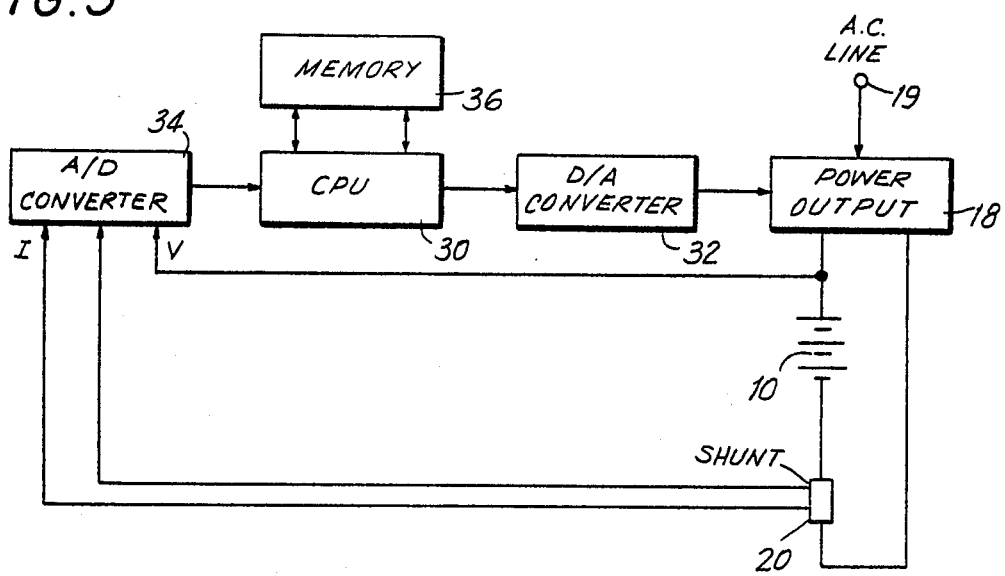
FIG. 3 is a block diagram of a preferred embodiment of apparatus incorporating the present invention.

The operation carried out by the apparatus illustrated in FIG. 1 has been described as being controlled by an operator. In accordance with a preferred embodiment of this invention, the operation carried out by the apparatus of FIG. 1 may be performed automatically, under the control of a programmed data processor, by the apparatus illustrated in FIG. 3. In FIG. 3, a programmed data processor referred to as central processing unit (CPU) 30 is connected with a memory 36, such as a read only memory (ROM) in which the program for CPU 30 is stored; and the CPU is further connected with a random access memory (RAM) in which data that is derived from and used in the test and charge cycles are stored. CPU 30 also is coupled to a digital-to-analog converter 32 which, in turn, is coupled to power output circuit 18. The D/A converter functions to supply the aforedescribed current and voltage control signals to the power output circuit during test and charge cycles, respectively, such that the test current and charge voltages may be supplied to battery 10, as discussed above. CPU 30 also is coupled to an analog-to-digital converter 34 which functions to convert the voltage V sensed across battery 10 and the current I through the battery to corresponding digital values. Such digital representations of battery voltage and current are supplied to CPU 30 wherein they are utilized and processed in conjunction with the test and charge cycles.

The functions performed by switch 16, variable current source 12 and voltage source 14 of FIG. 1 are carried out in an analogous manner by CPU 30. Thus, the CPU establishes the test and charge cycles alternately and repeatedly. During each test cycle, CPU 30 controls D/A converter 32 to supply the aforedescribed triangular or trapezoidal-shaped current control signals to output circuit 18. During each charge cycle, the CPU controls the D/A converter to supply the aforedescribed ramp voltage control signal to the power output circuit. In addition, depending upon the condition of battery 10, as determined during each test cycle, the slope of each ramp voltage signal is established in a manner analogous to the aforedescribed operation of adjustment knobs 15 and 17.

Also, CPU 30 processes the voltage and current measurements obtained during each test cycle in order to determine the charge capacity, state-of-charge and possible fault or defective conditions of battery 10. For example, memory 36 may store digital representations of the various voltage-current characteristics for different batteries. CPU 30 obtains the dynamic voltage-current characteristic for the battery under test and compares this characteristic to the stored representations. In this manner, various conditions of battery 10 may be determined. Furthermore, memory 36 may store digital representations of the preceding voltage-current characteristic which is obtained during a preceding test cycle; and CPU 30 may compare this stored, preceding characteristic to the latest voltage-current characteristic then obtained. In the event of a favorable comparison, for example, if the latest voltage-current characteristic obtained by CPU 30 is substantially congruent with the stored, preceding characteristic, the CPU determines that battery 10 has been fully charged, and the charging operation is terminated. Alternatively, memory 36 may store the test current levels at which discontinuities in the voltage-current characteristic, obtained during the preceding test cycle, have occurred. CPU 30 then compares the test current levels at which discontinuities occur in the latest voltage-current characteristic to such stored test current levels to determine if there has been any change in such occurrences. If no change is sensed, the CPU determines that the battery is fully charged.

In a preferred embodiment, memory 36 stores data representations of various "signatures" corresponding to different fault conditions which may be present in batteries of different storage capacities, numbers of cells, states-of-charge, and the like. CPU 30 functions to obtain the dynamic voltage-current characteristic of the battery under test and to compare this characteristic to such "signatures" to determine if such fault conditions are present in this battery.

Although not shown, the apparatus of FIG. 3 also may be provided with suitable displays, such as indicator lamps, which are selectively energized by CPU 30 in the event that particular fault conditions are sensed.

The various "look-up" tables mentioned hereinabove with respect to FIG. 1 may be stored in memory 36. Various features, or characteristics, of the dynamic voltage-current characteristic which is obtained by CPU 30 during a test cycle thus may be compared to the data stored in such "look-up" tables in order to determine, inter alia, the state-of-charge of battery 10, the charge capacity thereof as a function of the slope of the voltage-current characteristic, the expected gas voltage level $V_{gas}$, the number of cells of battery 10 as a function of the initial open-circuit voltage $V_o$, the expected locations of discontinuities in the voltage-current characteristic as a function of battery charge capacity, charge level and number of cells, the maximum battery current levels, during test and charge cycles, as a function of charge capacity, and the like.

A general flow chart of the program for CPU 30 is set out in FIG. 5. Before describing this flow chart, which will facilitate an understanding of the automatic charging apparatus illustrated in FIG. 3, reference is made to FIG. 4 which is a block diagram of power output circuit 18. This power output circuit is comprised of a voltage-controlled rectifier 40, an inverter 42, a transformer 44 and an output rectifier 48. Voltage controlled rectifier 40 is adapted to be supplied with AC power, as from AC line 19, and to rectify this AC power to produce DC currents in response to a control signal supplied thereto. This control signal is produced by CPU 30 and is dependent upon the determined number of cells of battery 10, the actual charge capacity of this battery and the state-of-charge thereof. Hence, the DC currents produced by voltage-controlled rectifier 40 are a function of the condition of battery 10.

The DC currents produced by voltage-controlled rectifier 40 are supplied to inverter 42 which functions to invert these DC currents to corresponding AC signals. Inverter 42 is controlled by CPU 30 to produce an AC signal which, when rectified, corresponds either to the test current or to the charging voltage described above. As an example, inverter 42 may include a pulse width modulator which generates pulse width modulated signals corresponding to the test current and to the charging voltage which should be supplied to battery 10. In one embodiment, a test current comparator is supplied with a signal representing the actual current flowing through battery 10, as derived by shunt element 20, to compare this current representation to the current control signal, i.e. to an analog version of the desired test current level then supplied by CPU 30. Any difference therebetween is used to control the pulse width modulator accordingly. Hence, the pulse width modulator generates pulses whose width increases and decreases in a manner corresponding to the positive and negative ramp portions of the test current. Such width-modulated pulses control switches, such as SCR switching devices, thereby generating a switched AC output. Such inverters are known to those of ordinary skill in the art.

Inverter 42 also may include a charge voltage comparator which is supplied with a signal representing the voltage across battery 10, and with the voltage control signal, i.e. a signal representing the analog version of the ramp charging voltage determined by CPU 30. Any difference between the actual battery voltage and the desired ramp voltage is used to control the aforementioned pulse width modulator which, in turn, operates the SCR switching devices to generate a corresponding switched AC signal at the output of the inverter. During a test cycle, the aforementioned charge voltage comparator is inhibited; and during a charging cycle, the aforementioned test current comparator is inhibited. Hence, the switched AC output of inverter 42 represents the appropriate test current during test cycles and also represents the appropriate charging voltage during charge cycles.

The switched AC signal generated at the output of inverter 42 is supplied to rectifier 48 via a transformer 44. The rectifier rectifies the switched AC signal, resulting in the appropriate triangular or trapezoidal-shaped test current, or the ramp-shaped charging voltage during test and charge cycles, respectively. It is appreciated that the magnitude of the switched AC output from inverter 42 varies as a function of the current and voltage control signals generated by CPU 30. As the magnitude of the switched AC output increases, the corresponding rectified DC currents and voltages correspondingly increase.

Desirably, primary winding 44a of transformer 44 is connected in parallel with a capacitor 46. The purpose of this capacitor is to minimize any change on the overall resonant frequency of transformer 44 in the event that the battery is disconnected. That is, if the battery is disconnected, transformer 44 exhibits a very high inductance which, in the absence of a load, tends to reduce the resonant frequency significantly. However, by connecting capacitor 46 in parallel with the primary winding 44a, the resonant frequency is determined by the combination of capacitor 46 and the inductance of transformer 44. Consequently, even if the battery is disconnected, there will be little change in the resonant frequency of the illustrated circuit.

Resonant frequency is important because inverter 42 operates at very high frequencies, on the order of 20 KHz. By operating at such high frequencies, sufficient current may be supplied to the battery during test and charge cycles without requiring very large transformer structures. Consequently, the overall weight and size of the charger apparatus may be reduced substantially.

In accordance with the relatively high switching frequencies of inverter 42, it is preferred that rectifier 48 be provided with, for example, three pairs of diodes, each pair being connected to a respective secondary winding (only one 44b being shown) of transformer 44. The cathodes of all of the diodes are connected in common to one terminal of battery 10, and the secondary windings are provided with center taps all connected in common to the other terminal of the battery. This embodiment improves the heat distribution in rectifier 48 and, moreover, each of the diodes may exhibit a relatively lower power rating than if only two diodes were provided in the rectifier. Since each diode is supplied with smaller AC currents, the diodes may exhibit faster turn-off times so as to to be used at the higher switching frequencies of inverter 42.

Turning now to FIG. 5, there is illustrated a flow chart of a general program for controlling CPU 30 to carry out alternate and repeated test and charge cycles. The CPU is initialized to a predetermined, initial condition. In this initialized state, a diagnostic subroutine may be carried out to determine that the CPU is in operable condition, and also to determine that battery 10 is properly connected, and that initial data is stored in appropriate locations of memory 36, and that D/A converter 32 and A/D converter 34 are in operable condition. After the initialized state is established, CPU 30 advances to carry out an initial test cycle. The subroutine by which the test cycle is carried out is described in greater detail hereinbelow with respect to the flow chart shown in FIGS. 7A and 7B. Suffice it to say that, during the test cycle, the CPU generates successive samples which represent a digitized version of a triangular or a trapezoidal current control signal, which control signal is converted to an analog control signal and supplied to power output circuit 18. Hence, in response to this control signal derived from CPU 30, the aforedescribed triangular or trapezoidal test current is supplied to battery 10.

It is appreciated that, as the test current level gradually increases, the voltage across battery 10 correspondingly increases. Since the charge capacity and state-of-charge of battery 10 has not yet been determined, the test current is controlled to make sure that the voltage produced across the battery in response to this test current does not exceed an initial predetermined voltage level. During this initial test cycle, the predetermined maximum voltage level is set at the gas voltage level $V_{gas}$ which, as discussed above, is approximately 2.35 volts/cell for a typical lead-acid battery. Unless the operator commands otherwise, it is assumed that battery 10 is a 6-cell battery.

At the beginning of the test cycle, that is, when the test current is substantially equal to zero, the voltage across battery 10 is read. This voltage is supplied as an analog signal to A/D converter 34 which, in turn, converts this analog level to a corresponding digital representation. This digitized voltage signal is supplied to CPU 30 whereat it is read. The program of the CPU then advances to divide this battery voltage by the factor 2 to approximate the number of cells included in battery 10. As discussed hereinabove, it is expected that the initial open-circuit voltage across battery 10, that is, the voltage produced in response to a substantially zero test current, will be in the range of about 1.8 volts/cell to about 2.2 volts/cell. Hence, by dividing the total battery voltage by the factor 2, the approximate number of cells included in the battery may be ascertained.

After the open-circuit battery voltage $V_o$ is determined, CPU 30 controls D/A converter 32 to generate the aforedescribed test current signal. As will be discussed hereinbelow, the CPU may, in accordance with its program, generate a digital representation of the test current level, which digital representation is incremented by a predetermined amount in successive time increments, thereby resulting in the positive ramp portion of the test current control signal. When this test current reaches a predetermined maximum current level, or when the voltage produced across battery 10 in response to this test current reaches its maximum voltage level (assumed, during the initial test cycle, to be equal to $V_{gas}$), the test current is maintained constant for a predetermined time, and then this test current is decremented in successive time steps so as to produce the negative ramp portion of the test current control signal. As the test current through battery 10 varies in this manner, the voltage across the battery is sensed by A/D converter 34 which, in turn, supplies CPU 30 with digitized representations, or samples of such voltage in successive time increments. Hence, CPU 30 now is provided with data representing the test current supplied to battery 10 and the voltage produced thereacross in response to that test current. This data is sufficient for CPU 30 to derive the voltage-current characteristic of the battery.

As the sensed battery voltage changes in response to each predetermined incremental change in the test current, the slope of the voltage-current characteristic is determined. CPU 30 may be programmed to store data representing the instantaneous slope of the V-I characteristic $A_1$ produced in response to the positive ramp portion of the test current, and also to store data representing the instantaneous slope of the V-I characteristic $A_2$ produced in response to the negative ramp portion of the test current. These instantaneous slopes then may be averaged, and the "mean" slope derived therefrom. It is recalled that the mean slope of the dynamic voltage-current characteristic is related to the actual charge capacity of battery 10. Memory 36 may store data representative of this charge capacity as a function of slopes of the V-I characteristics and also of the number of cells of different batteries. Based upon such stored data, which may be in the form of typical "look-up" tables, the appropriate charge capacity of battery 10 is determined.

Once this charge capacity is determined, CPU 30 advances to establish a maximum test current $I_{max}$ by dividing this determined charge capacity by the factor 2.5. This maximum test current level is stored in an appropriate location of memory 36.

The program of CPU 30 then advances so as to determine the actual state-of-charge of battery 10 as a function of the determined charge capacity and initial open-circuit battery voltage. Data representing typical charge levels may be stored in memory 36 as a function of charge capacity and open-circuit battery voltage. Hence, this data may be retrieved once the charge capacity and open-circuit voltage are known. Also, based upon this charge level, the gas voltage level $V_{gas}$ may be determined. As discussed above, the gas voltage level for most lead-acid batteries is equal to 2.35 volts/cell. However, the present invention is readily adapted to be used with those batteries having a gas voltage level which is a function of the state-of-charge and charge capacity thereof. Since the state-of-charge and charge capacity of the battery are known from the previous step of the illustrated program, the gas voltage level $V_{gas}$ may be readily retrieved from memory 36.

CPU 30 then advances to compare the instantaneous voltage V across battery 10 to the gas voltage level $V_{gas}$ which has been derived in the manner discussed above. Inquiry is made as to whether the instantaneous battery voltage is equal to this gas voltage level. If not, inquiry is made as to whether a discontinuity is present in the slope of the determined voltage-current characteristic. If the answer to this latter inquiry is in the affirmative, an indication that battery 10 contains a defective cell is provided. Thus, and as discussed above, if a discontinuity in the slope of the V-I characteristic is detected before the battery voltage reaches the gas voltage level $V_{gas}$, this is indicative of a defective cell.

However, if the instantaneous voltage produced across battery 10 is equal to the gas voltage level $V_{gas}$, or if the battery voltage is less than this gas voltage but no discontinuity in the slope of the V-I characteristic has been detected, the routine of CPU 30 advances to the next step illustrated in FIG. 5. This next step serves to determine the condition of the battery as a function of the dynamic voltage-current characteristic which has been obtained, as a function of the charge capacity which has been determined in a previous step, and as a function of the charge level which also has been determined in a previous step. For example, memory 36 may be provided with a suitable look-up table in which data representing different battery conditions, such as defective conditions, is correlated with charge capacity, charge level, sensed discontinuities in the V-I characteristic, and the like. Since all of this information either has been determined in previous steps, or is being read from A/D converter 34, the condition of battery 10 may be readily determined. As another example, memory 36 may store the aforementioned "signatures" which characterize certain predetermined fault conditions in batteries of different charge capacity, numbers of cells, and the like. The presently obtained battery voltage and current, which may be read directly under the control of CPU 30, may be compared to such "signatures". In the event of a positive comparison therebetween, a corresponding fault condition is detected. After sensing the battery condition, including the aforementioned fault conditions, the illustrated routine of CPU 30 advances so as to display such detected fault conditions. As mentioned previously, the battery charging apparatus may be provided with appropriate display lamps which are suitably energized to provide an operator with a visual indication of such fault conditions. If desired, any appropriate display may be provided, such as LED's, LCD's, audible alarms, and the like.

Preferably, but not necessarily, the condition of battery 10 may be determined, and detected fault conditions may be displayed, following the completion of a test cycle. Thereafter, the charge cycle is executed. In one embodiment, CPU 30 establishes the beginning, or commencing, voltage level of the ramp charging voltage as a function of the detected state-of-charge of battery 10. It is recalled that the open-circuit battery voltage which is obtained at the beginning of the test cycle, that is, when the test current is equal to zero, is related to the state-of-charge of the battery. In a previous step, this state-of-charge has been determined. Memory 36 also may store ramp voltage levels as a function of the determined state-of-charge, thereby facilitating a ready determination of the commencing voltage level for the ramp charging voltage. That is, based upon this determined state-of-charge, CPU 30 retrieves the corresponding ramp voltage level. In another embodiment, the CPU establishes the final, or ending, voltage level of the ramp charging voltage as a function of the detected state-of-charge of the battery. That is, the ramp charging voltage commences at the same predetermined level at the start of each charge cycle, and then decreases at a selected slope toward this final voltage level.

Furthermore, CPU 30 selects the appropriate slope of the ramp charging voltage as a function of the battery voltage which was obtained during the preceding test cycle. This ramp slope is set out in Table I, above, and is also illustrated in the block identified as "charge cycle" in FIG. 5. It is appreciated that memory 36 may store data corresponding to Table I; and the ramp slope data therein may be retrieved as a function of the sensed battery voltage during the preceding test cycle. Thus, the level and slope of the ramp charge voltage are determined as a function of the tested condition of battery 10. Stated otherwise, the parameters of the ramp charging voltage are established as a function of the last-obtained dynamic voltage-current characteristic of battery 10.

After the parameters of the ramp charging voltage have been established, as aforesaid, the program for CPU 30 advances to the routine wherein the current drawn by the battery during the charge cycle is monitored. As mentioned above, although the battery current is not controlled during the charging cycle, it is monitored to make sure that it does not exceed a level which possibly could damage the battery. This maximum current level varies from one battery to another and is a function of the charge capacity thereof. As a numerical example, the maximum battery current $I_{max}$ during the charging cycle is maintained less than the charge capacity (in amp-hours) divided by the factor 3.75. Since the charge capacity has been determined in a previous step, i.e., as a function of the "mean" slope of the voltage-current characteristic, it is appreciated that the maximum current level may be readily determined. Memory 36 may store data representing maximum current levels corresponding to batteries of different amp-hour charge capacities. CPU 30 selects the appropriate maximum current level as a function of the determined charge capacity of battery 10. Once this maximum current level is selected, the actual current drawn by battery 10 during the charging cycle is monitored to make sure that it remains below this maximum level. In the event that the battery current during the charging cycle rises to this maximum current level $I_{max}$, the magnitude of the ramp charging voltage is reduced so as to correspondingly reduce the battery current. It is appreciated that this prevents a potentially hazardous condition from occurring, and avoids damage to the battery.

After the conclusion of the charging cycle, another test cycle is carried out. This test cycle is substantially similar to the aforedescribed initial test cycle, except that the magnitude of the test current now may be increased to a level corresponding to the charge capacity of the battery being tested. Also, in the present test cycle, as well as subsequent test cycles of battery 10, the maximum battery voltage which may be produced thereacross now is permitted to be equal to the level $V_{max}$ which is greater than the gas voltage level $V_{gas}$. It is recalled that, during the initial test cycle, information regarding the condition of the battery had not yet been obtained. Thus, prior to executing the initial test cycle, the number of battery cells, actual charge capacity, state-of-charge and possible fault or defective conditions generally were not known. Consequently, to avoid damage to the battery, the maximum test current level and maximum battery voltage level deliberately were maintained relatively low. Now, however, after the initial test cycle has been completed, the aforementioned conditions and characteristics of the battery are determined. Consequently, the maximum current and voltage levels during this and subsequent test cycles now may be selected as a function of such conditions. For example, the maximum current level now may be set to be equal to the charge capacity of the battery (which has been determined in a previous step) divided by the factor 2.5. Likewise, in the absence of a fault condition which would prevent otherwise, the maximum voltage level now may be set equal to about 2.6 volts/cell. Alternatively, if the maximum voltage level is to be a function of the charge capacity and present state-of-charge of battery 10, memory 36 may store data which correlates such maximum voltage, charge capacity and state-of-charge levels such that the appropriate maximum voltage level, based upon the determined charge capacity and state-of-charge, may be retrieved.

Now that the appropriate maximum current and voltage levels have been selected, the test cycle may be carried out. As the test current changes in successive time steps, as discussed above, A/D converter 34 supplies CPU 30 with digital representations of corresponding battery voltage levels. Hence, CPU 30 may obtain the dynamic voltage-current characteristic of the battery during this test cycle. This V-I characteristic is compared to the V-I characteristic obtained during the previous test cycle. In particular, and preferably, abrupt changes or discontinuities in the slope of the presently obtained V-I characteristics are sensed. Such discontinuities, if any, are compared to discontinuities which may have been sensed during the preceding test cycle. Inquiry then is made as to whether the presently obtained discontinuities occur at the same test current levels as during the preceding test cycle. If this inquiry is answered in the affirmative, it is considered that battery 10 has been fully charged and the charging operation is terminated. However, if this inquiry is answered in the negative, the illustrated routine returns to those subroutines whereby the actual charge capacity, state-of-charge, number of battery cells, and the like are re-determined. It is appreciated that CPU 30 repeatedly advances through the program loop illustrated in FIG. 5 until the last-obtained voltage-current characteristic is substantially identical to the preceding voltage-current characteristic.

In the preceding discussion, the determination that battery 10 has been fully charged is based upon sensing that the discontinuities in the voltage-current characteristics during succeeding test cycles are substantially identical. As an alternative, since CPU 30 obtains data representing the entire V-I characteristic, including the hysteresis therein, such digitized versions of the V-I characteristics which are obtained during succeeding test cycles may be compared to each other. If such comparison is positive, battery 10 is considered to be fully charged and the charging operation is terminated.

Thus, it is seen that the overall charging operation is carried out in a period of time that is dependent upon the actual state-of-charge of the battery. Contrary to charging devices which have been used heretofore, a fixed charging time duration for the overall charging operation is not established. Rather, the overall charging duration is variable, and is dependent upon the actual condition of the battery. Furthermore, the overall charging operation is formed of test and charge cycles which are repeated, alternately, until the battery is fully charged. During each charge cycle, the battery is charged with a ramp voltage whose parameters are determined by the condition of the battery which is obtained during a preceding test cycle.

Figure 6:
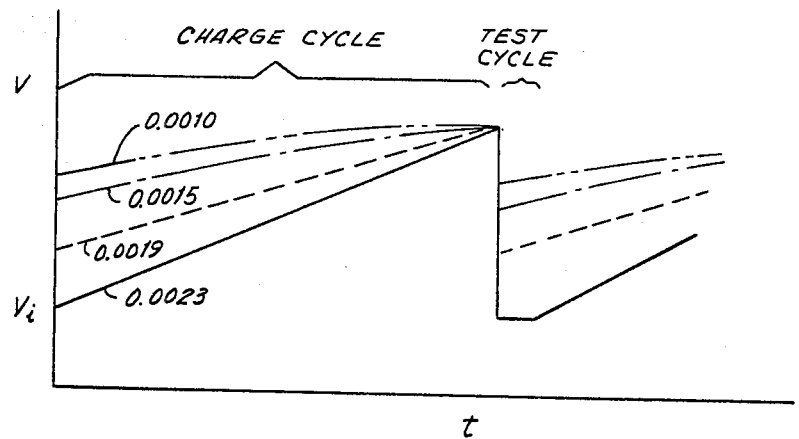
FIG. 6 is a waveform diagram of the charging voltage which is used in the battery charging operation.

FIG. 6 is a waveform diagram of one example of a positive-going ramp voltage which may be supplied during each charge cycle to battery 10 under control of CPU 30. It is seen that successive charge cycles are separated by a test cycle of substantially shorter duration. FIG. 6 does not illustrate either the test current which is supplied to the battery during each test cycle, or the voltage which is produced across the battery as a result of this test current.

From FIG. 6, it is seen that the slope of the ramp voltage may vary. This variation is described above with respect to Table I. Hence, as the voltage produced across battery 10 reaches predetermined threshold levels during different test cycles, the slope of the ramp voltage is reduced accordingly. FIG. 6 also represents the initial or starting voltage level $V_i$ for each positive-going ramp voltage. As discussed above, this starting voltage $V_i$ is a function of the open-circuit voltage of battery 10 which is measured during the preceding test cycle. As this open-circuit voltage increases, thus representing the state-of-charge of the battery, the starting voltage level $V_i$ likewise increases. Hence, as the battery becomes more fully charged, the ramp charging voltage is modified. It is, therefore, seen that the charging operation is "matched" to the condition of the battery.

A negative-going ramp voltage which may be supplied to battery 10 during each charge cycle is not shown in FIG. 6. It will be appreciated, however, that such a ramp voltage commences at the illustrated peak voltage level, and then decreases at a selected one of the representative slopes to a final voltage level which may be equal to $V_i$.

The subroutine by which CPU 30 is controlled during a test cycle to generate the current control signal which, in turn, controls power output circuit 18 to supply the aforementioned test current to battery 10, now will be described with reference to the flow charts shown in FIGS. 7A and 7B. It will be appreciated that these flow charts serve to generate a trapezoidal-shaped test current. However, these flow charts may be modified so as to result in a triangular test current.

Figure 7A:
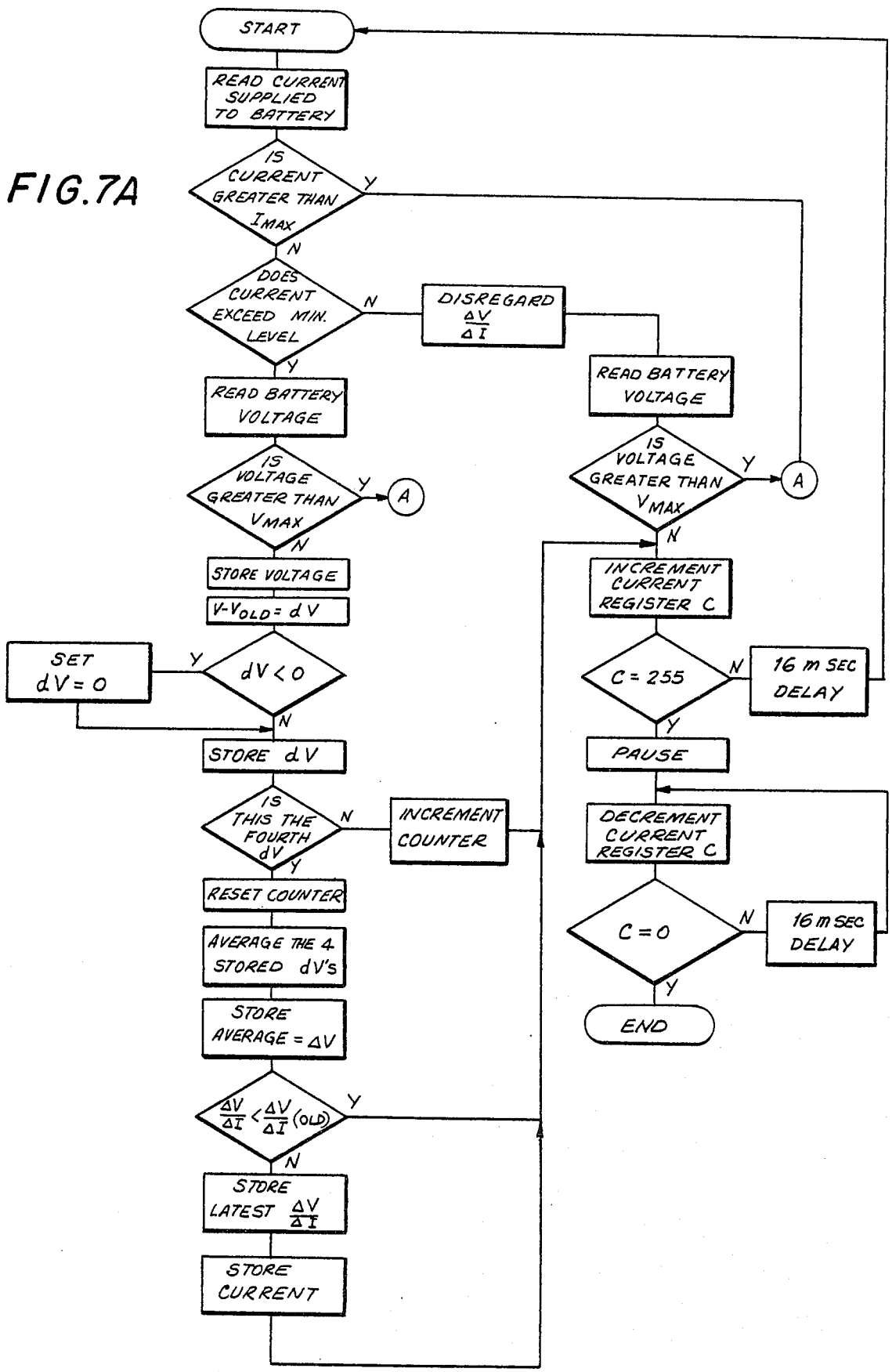
FIGS. 7A–7B comprise a flow chart representing a test cycle routine carried out by the data processor which is used with the present invention.
Figure 7B:
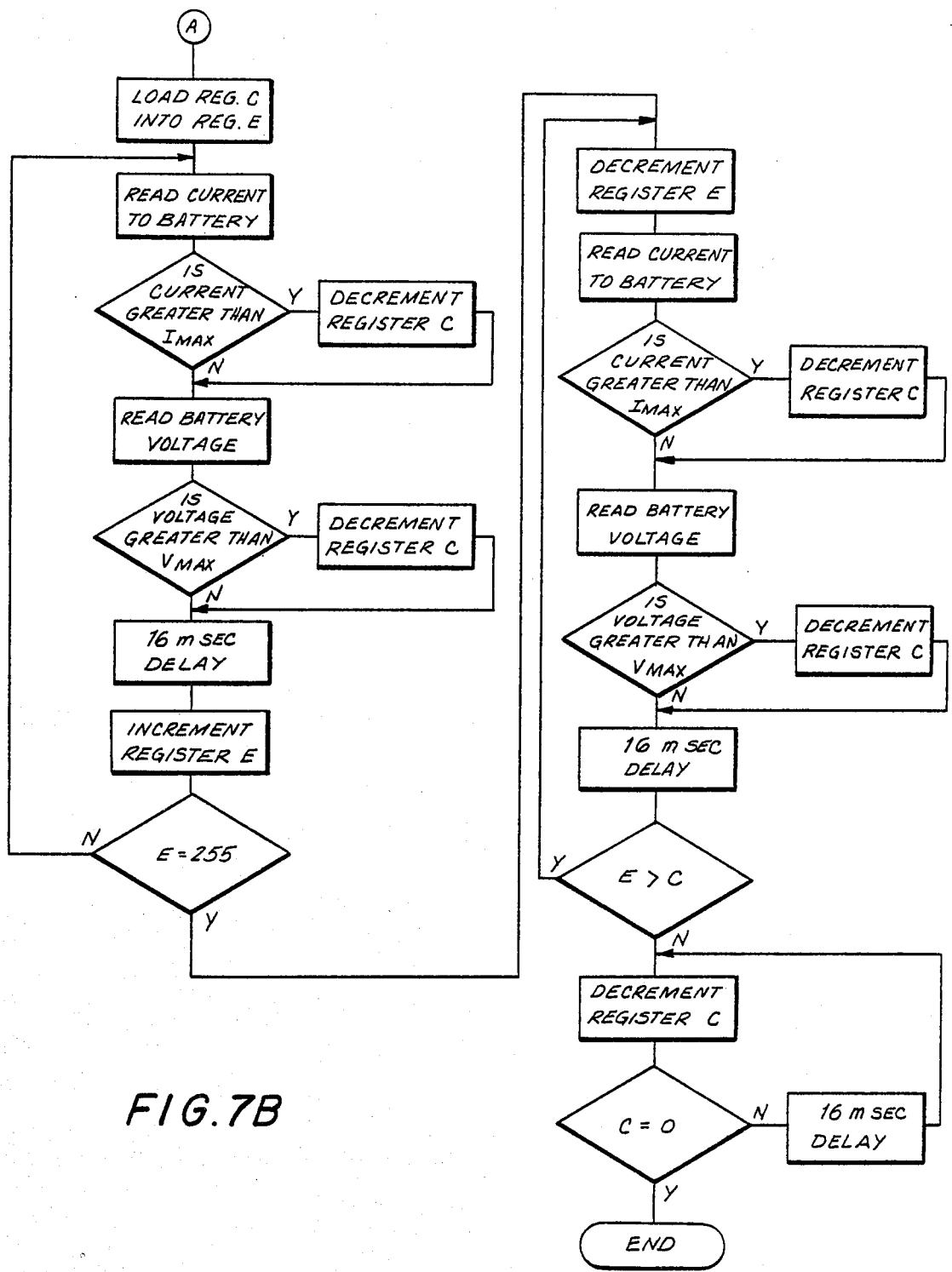

When the program of CPU 30 advances to the test cycle subroutine, the START condition illustrated in FIG. 7A is assumed. This subroutine then is carried out in the following manner: Initially, the current supplied to battery 10 by power output circuit 18 is read. A digital representation of this current is supplied to CPU 30 by A/D converter 34, as described above. Inquiry then is made as to whether this battery current is greater than the pre-set maximum test current $I_{max}$. As described above, this maximum current $I_{max}$ is equal to the charge capacity of the battery (in amp-hours) divided by the factor 2.5. During the initial test cycle, since the actual charge capacity of the battery is not yet known, i.e. it has not yet been determined, this maximum current level may be set to a substantially lower value. If this inquiry is answered in the affirmative, the subroutine advances to the flow chart shown in FIG. 7B. It is expected that, at the beginning of a test cycle when the test current is substantially equal to zero, this inquiry will be answered in the negative.

Then, inquiry next is made as to whether the test current supplied to battery 10 exceeds a minimum level. If the test current is too low, i.e., if it is less than this minimum current level, the voltage then produced across the battery is not truly responsive to this test current. Hence, it is desirable to ignore the voltage response due to such low test current levels. Consequently, if this inquiry is answered in the negative, any change in the measured battery voltage is disregarded, thereby ignoring any data which then may be obtained regarding the slope of the voltage-current characteristic. Nevertheless, even if the test current level is too low, the voltage then produced across battery 10 is read. Inquiry then is made as to whether this battery voltage is greater than a maximum voltage level $V_{max}$. It is recalled that this maximum voltage level may be preset to be equal to about 2.6 volts/cell, or may be a function of the charge capacity and charge level of the battery. During an initial test cycle wherein charge capacity and charge level have not yet been determined, this maximum voltage level is set equal to the gas voltage level $V_{gas}$.

It is expected that, during the initial stages of the test cycle, this inquiry will be answered in the negative. Then, a counter, or register, referred to herein as the C register, is incremented by one count. The count of the C register is adapted to be incremented from an initial count of zero to a maximum count of 255. Each count of the C register may be decoded and used to generate a test current whose level is determined by this decoded count. Thus, as the C register is incremented, the level of the test current correspondingly increases. Conversely, if the count of the C register is decremented, as will be described, the test current level correspondingly is reduced. At the present stage of the illustrated subroutine, it is assumed that the C register has been incremented from a count of zero to a count of one. Accordingly, after this C register has been incremented, inquiry is made as to whether the count therein is equal to 255. This inquiry now is answered in the negative and, after a 16 msec. delay, the subroutine returns to its START condition. Thereafter, the aforedescribed loop of the subroutine is re-executed. It is seen that the C register is incremented by one count every 16 msec. Thus, the C register will be incremented from its initial count of zero to its maximum count of 255 in about 4 seconds. Since the test current level is increased in response to this incrementing of the C register, it is recognized that, as this register is incremented, the test current exhibits a positive ramp portion whose slope is equal to $I_{max}/4$ amps per second.

Eventually, the test current level will exceed the aforementioned predetermined minimum level. At that time, the inquiry as to whether the test current level exceeds the minimum current level will be answered in the affirmative, and the subroutine advances to read the battery voltage. Inquiry is made as to whether this battery voltage is greater than the aforementioned maximum voltage level $V_{max}$. If this inquiry is answered in the affirmative, the subroutine advances to the flow chart shown in FIG. 7B. For the present discussion, it will be assumed that the battery voltage does not exceed the maximum voltage level $V_{max}$. Hence, the subroutine advances to store this battery voltage; and then, the preceding stored battery voltage, referred to as $V_{old}$, is subtracted from the present value of the stored battery voltage. This difference between the present battery voltage V and the preceding battery voltage $V_{old}$ is designated as the change in voltage dV. It is recognized that this change in voltage dV is attributed to the incemental increase in the test current supplied to the battery.

Inquiry then is made as to whether this change in voltage dV is a negative voltage. During the positive ramp portion of the test current, it is expected that voltage changes dV will be positive. If a negative voltage change is determined, this change is set equal to zero (dV=0). Then, the change in voltage dV is stored. This stored voltage change dV is either the actual positive voltage change that has been measured or, alternatively, the stored voltage change dV is the zero voltage change which has been assumed in the event that the actual voltage change dV is negative.

It is expected that, as the test current increases in incremental steps, aberrations may be present in the battery voltage that is read in response thereto. It is desirable to "smooth" such aberrations. This is attained by storing four successive voltage changes dV and then averaging such stored changes to produce an average voltage change ΔV. The dynamic voltage-current characteristic, and particularly the slope of that V-I characteristic, is determined as a function of the average voltage change ΔV that is produced in response to the corresponding change in current ΔI due to four successive incremental increases in the test current. In accordance with this averaging feature, after the actual change in voltage dV is stored, inquiry is made as to whether this is the fourth occurrence, or measure, of a voltage change. If this inquiry is answered in the negative, a counter which is provided for the purpose of determining when four incremental voltage changes have been measured, is incremented. Then, the C register is incremented so as to correspondingly increase the level of the test current supplied to the battery. After the C register has been incremented, inquiry is made as to whether its count is equal to 255. If this inquiry is answered in the negative, the subroutine returns to its START condition, after a 16 msec. delay. Then, the foregoing loop is followed once again.

Ultimately, as the test current level is increased, and as voltage changes are measured and stored, the fourth incremental voltage change dV will be stored. At that time, the counter which keeps track of the number of such voltage changes that have been measured will attain a count of 4. Hence, the inquiry as to whether the fourth voltage change dV has been stored is answered in the affirmative. The voltage-change counter then will be reset to its initial count of, for example, zero. Then, an average value ΔV of the four stored incremental voltage changes dV will be produced, and this average change in voltage ΔV is stored.

After the average change in voltage ΔV is stored, a representation of the slope ΔV/ΔI is produced. It is appreciated that, since the test current is incremented in equal steps, the stored, average change in voltage ΔV will, by itself, be a sufficient indication of the slope of the dynamic voltage-current characteristic then being obtained for the battery. Inquiry is made as to whether the latest measure of slope ΔV/ΔI is less than the preceding representation of the slope ΔV/ΔI (old). If this inquiry is answered in the affirmative, that is, if the present measure of the slope of the voltage-current characteristic is less than the preceding measure of its slope, the subroutine advances to increment the C register, as illustrated, and the subroutine recycles to the loop discussed hereinabove. However, if it is determined that the present measure of the slope of the dynamic voltage-current characteristic is equal to or greater than the preceding measure of its slope, the present measure of slope ΔV/ΔI is stored. It is appreciated that this stored measure of slope is used, during the next cycle of the illustrated subroutine, as a measure of the preceding, or "old" measure of slope.

After storing the latest measure of slope ΔV/ΔI, the level of the test current then supplied to the battery which results in this slope of the dynamic voltage-current characteristic also is stored. The subroutine then advances to increment the C register, and the foregoing process is repeated.

Thus, it is seen that, during each cycle of the subroutine illustrated in FIG. 7A, the test current is sensed, or read, to determine whether it exceeds the predetermined maximum current level $I_{max}$. Also, the voltage produced across the battery in response to the test current likewise is sensed, or read, to determine if it exceeds the predetermined maximum voltage level $V_{max}$. In the event that neither the maximum current level nor the maximum voltage level is exceeded, the change in the voltage due to the incremental increase in the test current is obtained, and successive voltage changes dV are averaged to obtain an average change in voltage ΔV. This average change in voltage ΔV is combined with the change in test current ΔI so as to derive the dynamic voltage-current characteristic of the tested battery. CPU 30 utilizes the data obtained for the dynamic voltage-current characteristic to determine the aforementioned conditions of the battery, as well as to establish the parameters of the ramp voltage which is used during the charge cycle.

Figure 8:
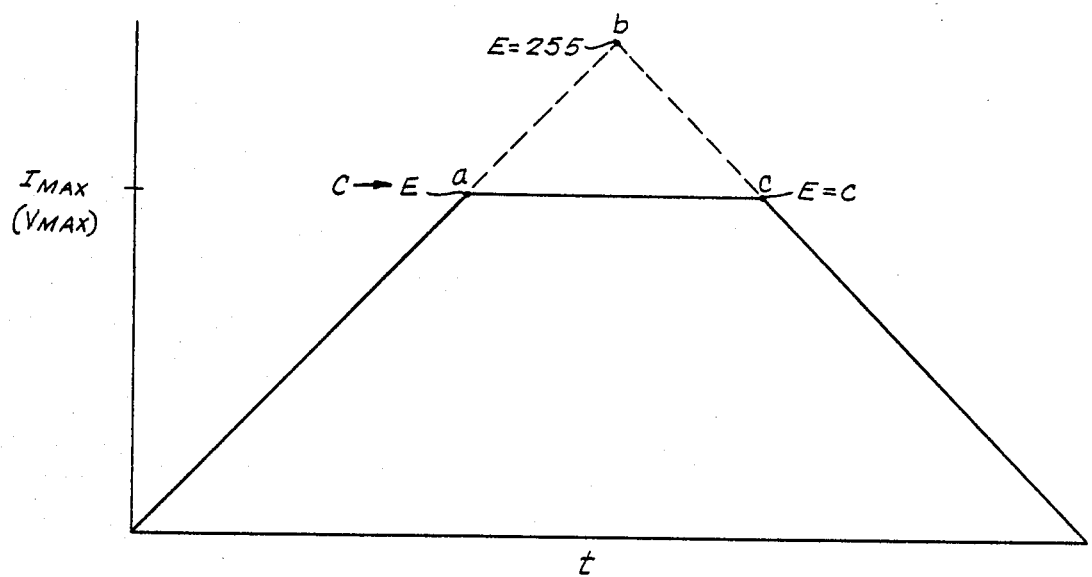
FIG. 8 is a waveform of the charging current that is supplied during the test cycle of the present invention.

Referring now to FIG. 8, it is seen that, as counter C is incremented with respect to time (e.g. the count is increased by 1 every 16 msec.), the test current likewise is increased by a predetermined amount. Hence, during successive time steps, the test current is increased by equal increments, resulting in the positive ramp portion illustrated in FIG. 8.

Let it be assumed that, when the positive ramp portion of the test current reaches point a, shown in FIG. 8, the pre-set maximum battery current (or battery voltage) is sensed. In the flow chart shown in FIG. 7A, this is indicated by an affirmative answer to the inquiry as to whether the test current is greater than the maximum current level $I_{max}$, or an affirmative answer to the inquiry as to whether the battery voltage is greater than the maximum voltage level $V_{max}$. Let it be further assumed that the count then present in register C, at the time that point a is reached, is less than 255. If the battery current or voltage exceeds the maximum pre-set current or voltage levels, the subroutine advances to the flow chart shown in FIG. 7B. According to the illustrated flow chart, the count then present in the C register is loaded into yet another register, designated the E register. It should be appreciated that the contents of the C register are not destroyed at this time. Then, the test current supplied to the battery is sensed, or read. Inquiry again is made as to whether this test current exceeds the pre-set maximum current level $I_{max}$. If the answer to this inquiry is answered in the affirmative, the C register is decremented so as to correspondingly reduce the test current. It is expected that this decrement in the test current will reduce it below the maximum current level $I_{max}$.

If the test current is less than the maximum current level $I_{max}$, or after the C register has been decremented, the voltage across the battery is sensed, or read. Inquiry is made as to whether this battery voltage exceeds the pre-set maximum voltage level $V_{max}$. If this inquiry is answered in the affirmative, the C register is decremented once again so as to correspondingly reduce the test current supplied to the battery. It is expected that this further reduction in the test current will reduce the battery voltage below the maximum level $V_{max}$. If the battery voltage is less than the maximum voltage level $V_{max}$, or after the C register has been decremented once again, a 16 msec. delay ensues, and then the E register is incremented. Thereafter, inquiry is made as to whether the count of the E register now has reached the predetermined count of 255. If this inquiry is answered in the negative, the loop illustrated in FIG. 7B is repeated, wherein the test current is read, reduced, if necessary, to be below the maximum current level $I_{max}$, the battery voltage is read, reduced, if necessary, to bring it below the maximum voltage level $V_{max}$, and the E register is incremented. The broken line extending between points a and b in FIG. 8 illustrates this incrementing of the E register. It is appreciated that, although the E register is incremented, the count present in the C register remains fixed. This fixed count corresponds to a constant test current level which is substantially equal to the maximum current level $I_{max}$.

Ultimately, the E register is incremented to a count of 255. At that time, the inquiry as to whether the count of the E register is equal to 255, as illustrated in the aforedescribed loop of FIG. 7B, is answered in the affirmative. That is, when point b shown in FIG. 8 is reached, this inquiry is answered in the affirmative. Then, the E register is decremented by 1. Once again, the test current supplied to the battery is sensed, or read, and this test current is adjusted, if necessary, to bring it just below the maximum current level $I_{max}$. This adjustment in the current is obtained by decrementing the count then present in the C register.

After reading and, optionally, adjusting the test current level, the voltage produced across the battery in response to this test current is sensed, or read. If this battery voltage exceeds the pre-set maximum voltage level $V_{max}$, it is adjusted to bring it just below this maximum voltage level, such as by reducing the test current supplied to the battery. It is recognized that the test current level is reduced by decrementing the count of the C register. Then, after reading and, optionally, correcting the battery voltage, a 16 msec. delay ensues; and then inquiry is made as to whether the count then present in the E register is greater than the count present in the C register. If this inquiry is answered in the affirmative, the aforedescribed loop, by which the E register is decremented, is executed once again. The broken line extending from point b to point c in FIG. 8 represents this decrementing of the E register in successive time steps. When point c is reached, the count then present in the E register is equal to the count of the C register. At this time, the inquiry as to whether the contents of the E register are greater than the contents of the C register is answered in the negative. Thereafter, the C register is decremented, and then inquiry is made as to whether the count of the C register is equal to zero. If this inquiry is answered in the negative, a 16 msec. delay ensues, and then the C register is decremented once again. Hence, it is recognized that the C register is decremented in successive time steps of 16 msecs. duration. As the count of the C register is decremented, the level of the test current is correspondingly reduced by equal increments. This gradual reduction in the test current in successive time steps is illustrated by the negative ramp portion, shown by the solid line in FIG. 8.

Ultimately, the C register is decremented to a count of zero. At that time, the inquiry as to whether this count is equal to zero is answered in the affirmative. At that time, the test current is substantially equal to zero, and the test cycle terminates.

The charge cycle now may be carried out in the manner described hereinabove. It is appreciated that, during the preceding test cycle, as described above, voltage and current readings are obtained such that the CPU may obtain the dynamic voltage-current characteristic of the battery under test. Also, changes in slope of the V-I characteristic are determined, and the test current levels at which such changes are detected are stored. CPU 30 may compare successive changes in slope to locate discontinuities in the voltage-current characteristic. Since the test current levels for each slope measurement are stored, a comparison, during succeeding test cycles, of the locations of discontinuities thus may be made so as to ascertain when the battery has been charged to its fully-charged level, as discussed in detail hereinabove.

FIG. 8 is a graphical representation of the manner in which the test current is generated, with respect to time, as the C and E registers are incremented and decremented in successive time steps. It is seen that the test current level remains substantially constant for the duration required for the E register to be incremented from its initial count, that is, the count which has been loaded thereinto from the C register, to the count of 255, and then to return from this count of 255 to its initial count. During this duration, the test current remains substantially constant, except for minor adjustments which may be made to ensure that the battery current and voltage levels do not exceed their pre-set maximum levels. That is, although the C register no longer is incremented when the test current reaches its pre-set maximum level, this test current remains at its substantially constant level for the duration equal to the time that would have been needed for the C register to reach the count of 255 and then return to the count last attained thereby. This time duration, that is, the duration over which the test current remains substantially constant, is a function of the count reached by the C register at the time that the test current reaches its maximum current level $I_{max}$. If the pre-set maximum current level $I_{max}$ is higher than illustrated, the count of the C register will be greater when point a is reached, thereby decreasing the duration over which the test current remains substantially constant. Conversely, if the pre-set maximum current level $I_{max}$ is less than illustrated, the C register will be incremented to a lower count at the time that point a is reached, thereby increasing the time duration over which the test current remains substantially constant. Thus, in the subroutine described hereinabove, it is appreciated that the test cycle extends for a substantially constant duration, e.g. 8 seconds, with the duration of the constant current level being a function of the pre-set maximum current level $I_{max}$.

It is appreciated that, while the test current level remains constant from point a to point c, the level of this constant current, i.e. $I_{max}$, is sufficient to induce bubbling in the acid of the battery thereby destratifying the electrolyte.

It is appreciated that, if the maximum current level $I_{max}$ is equal to or greater than the current level at which point b is reached, the test current will be substantially triangular in shape. Returning to the flow chart shown in FIG. 7A, the inquiry as to whether the battery current (or voltage) exceeds the pre-set maximum level $I_{max}$ (or $V_{max}$) always will be answered in the negative. Hence, the subroutine shown in FIG. 7A will not advance to that shown in FIG. 7B. Rather, the C register will be incremented, with a corresponding incremental increase in the test current, until the count thereof is equal to 255. At that time, the inquiry as to whether the count of the C register is equal to 255 will be answered in the affirmative. Thereafter, following a brief pause, the C register will be decremented in successive time steps. This decrementing will continue until the inquiry as to whether the count of the C register is equal to zero is answered in the affirmative. At that time, the test cycle subroutine terminates.

In the aforementioned operation, it is appreciated that, as the C register is incremented, the test current is increased by equal increments in successive time steps until the point b is reached; and then the test current is decremented by equal increments in successive time steps until substantially zero current is reached.

While the present invention has been particularly shown and described with reference to certain preferred embodiments thereof, it will be readily appreciated by those of ordinary skill in the art that various changes and modifications in form and details may be made. For example, CPU 30 may, preferably, be formed of a microprocessor, such as an Intel Model 8085 microprocessor. Memory 36 may be comprised of conventional ROM and RAM chips of the type normally utilized with an Intel Model 8085 microprocessor. If desired, alternative programmed data processing devices may be used.

The preceding has described the technique of the present invention, by which the operating characteristics and/or condition of battery 10 is tested, in conjunction with apparatus for controllably charging that battery as in accordance with its test results. If desired, the program illustrated by the flow chart of FIG. 5 may be modified to eliminate the charge cycle, thereby resulting merely in apparatus for testing a storage battery. It is intended that the appended claims be interpreted as including such changes and modifications.

What is claimed is:

1. A method of testing an electrical storage battery of the type having a pair of output terminals, to obtain information relating to a fault condition and/or characteristics thereof, said method comprising the steps of supplying to said battery a gradually increasing charging current to increase the voltage of the battery toward and beyond the gas voltage level thereof, followed by a gradually decreasing charging current, said currents being supplied over a predetermined current-level range; measuring said voltage produced across said pair of output terminals of said battery in response to the increasing and decreasing currents supplied thereto while said currents are being supplied; obtaining the dynamic voltage-current characteristic loop of said battery as a function of the measured voltage and the increasing and decreasing currents supplied over said predetermined range, said dynamic voltage-current characteristic loop having a first portion produced in response to said increasing charging current and a second portion produced in response to said decreasing charging current; and determining the operating condition, including a fault condition, and/or characteristics of said battery as a function of the obtained voltage-current characteristic loop.

2. The method of claim 1 wherein said step of determining the operating condition, including a fault condition, and/or characteristics of said battery comprises comparing the obtained voltage-current characteristic loop to a predetermined voltage-current characteristic loop representing batteries of the type being tested and known to be in desirable operating condition, said predetermined voltage-current characteristic loop being provided over the same range of ramp currents as the range of currents used to produce said obtained voltage-current characteristic loop; and determining the operating condition and/or characteristics of said battery as a function of said comparison.

3. The method of claim 2 wherein said step of obtaining the dynamic voltage-current characteristic loop includes obtaining the open-circuit voltage produced across said pair of output terminals of said battery in response to substantially zero charging current; and said predetermined voltage-current loop is the voltage-current characteristic loop which includes an open-circuit voltage substantially equal to the open-circuit voltage obtained for the battery under test.

4. The method of claim 2 wherein said step of obtaining the dynamic voltage-current characteristic loop further comprises determining the slope of said obtained voltage-current characteristic loop, thereby representing the charge capacity of the battery under test; and said predetermined voltage-current characteristic loop is the voltage-current characteristic loop representing batteries having substantially the same charge capacity as that determined for said battery under test.

5. The method of claim 1 further comprising the steps of determining the slope of said dynamic voltage-current characteristic loop, thereby representing the charge capacity of the battery under test; obtaining the open-circuit voltage produced across said output terminals of said battery in response to substantially zero charging current; comparing the obtained open-circuit voltage to reference open-circuit voltage levels associated with batteries having substantially the same charge capacity as that determined for said battery under test; and determining the charge condition of said battery under test as a function of said comparison.

6. The method of claim 5 further comprising the steps of sensing predetermined changes in the slope of said obtained voltage-current characteristic loop; and determining that said battery under test is charged to its gassing condition when said predetermined changes in said slope are sensed at a preselected charge condition for said determined charge capacity of said battery under test.

7. The method of claim 6 further comprising the step of determining a fault condition in said battery under test if said predetermined changes in said slope are sensed at less than said preselected charge condition.

8. The method of claim 1 wherein said step of supplying increasing and decreasing charging currents comprises generating an increasing ramp current followed by a decreasing ramp current; and supplying said ramp currents to said battery.

9. The method of claim 8 wherein said step of generating an increasing ramp current followed by a decreasing ramp current comprises increasing the current supplied to said battery by equal increments in successive time steps; sensing if said current or voltage produced across said battery output terminals exceed predetermined current or voltage levels, respectively; if said predetermined current or voltage levels are exceeded, maintaining said current at a substantially constant level for the duration equal to the time that would have been needed for said time steps to reach a predetermined number and then return to the step last attained thereby; and decreasing the current supplied to said battery by equal increments in successive time steps until substantially zero current is supplied.

10. The method of claim 9 further comprising the steps of incrementing first counter means with each incremental increase in said current supplied to said battery; loading second counter means with the count reached by said first counter means when said predetermined current or voltage levels are exceeded; successively incrementing said second counter means from the loaded count thereof until a predetermined count is reached, and thereafter successively decrementing said second counter means until the count thereof is equal to the count of said first counter means; and then decrementing said first counter means with each incremental decrease in said current supplied to said battery.

11. The method of claim 10, further comprising the steps of decrementing said current supplied to said battery and decrementing said first counter means, after said second counter means is loaded with the count reached by said first counter means, such that said predetermined current and voltage levels are not exceeded.

12. A method of testing an electrical storage battery of the type having a pair of output terminals to obtain information relating to the charge condition, fault condition and operating characteristics thereof, said method comprising the steps of supplying a gradually increasing ramp charging current followed by a gradually decreasing ramp charging current to said battery; measuring the voltage produced across said pair of output terminals of said battery in response to the ramp currents supplied thereto while said currents are being supplied; comparing the measured voltage to predetermined standard voltages representing batteries of the type being tested and known to be in desirable operating condition; and determining the charge condition, fault condition and operating characteristics of the battery under test as a function of said comparison.

13. The method of claim 12, further comprising the step of storing digital data representing operating conditions and/or characteristics correlated with said predetermined standard voltages; and wherein said step of comparing the measured voltage to said predetermined standard voltages comprises converting said measured voltage to corresponding digital representations thereof, and comparing said converted digital representations to said stored data to determine the operating condition and/or characteristics of said battery under test.

14. The method of claim 12 wherein said step of determining the operating condition and/or characteristics as a function of said comparison comprises sensing relatively abrupt changes in said measured voltage, and providing an indication of a battery fault if said abrupt change occurs at a measured voltage that is less than a predetermined one of said standard voltages.

15. A method of testing an electrical storage battery of the type having a pair of output terminals, to obtain information relating to a fault condition of said battery, said method comprising the steps of supplying a gradually increasing charging current followed by a gradually decreasing charging current to said battery; measuring the voltage produced across said pair of output terminals of said battery in response to the charging currents supplied thereto while said charging currents are being supplied; comparing the measured voltage to predetermined voltages representing predetermined fault conditions in batteries of the type being tested; and determining the existence of a fault condition in the battery under test as a function of said comparison.

16. The method of claim 15 further comprising the step of storing digital data representing said predetermined voltages associated with respective levels of charging current; and wherein said step of comparing comprises converting said measured voltage to digital representations thereof, and comparing each converted digital representation produced in response to a corresponding level of said charging current to the stored digital data associated with that level of charging current.

17. A method of testing an electrical storage battery of the type having a pair of output terminals, to obtain information relating to the operating characteristics thereof, said method comprising the steps of storing standard voltage level data representing respective battery charge levels; storing voltage-current characteristic loop data corresponding to curves of the relationship between changes in battery voltage as current supplied to the battery varies, said voltage-current characteristic data representing respective battery charge capacities; supplying a controllably varying charging current to said battery; measuring the voltage produced across said battery output terminals in response to the current supplied thereto while said current is being supplied; obtaining the dynamic voltage-current characteristic loop of said battery as a function of the measured voltage; comparing said obtained voltage-current characteristic loop to the stored voltage-current characteristic loop data; comparing the voltage measured when said charging current is substantially zero to said stored standard voltage level data; and indicating the charge capacity and charge level of the battery under test as a function of said comparisons.

18. Apparatus for testing a battery comprising energizing means coupled to said battery to supply energy thereto; sensing means coupled to said battery to sense voltage thereacross and current thereto; and control means coupled to said energizing means and to said sensing means for supplying a gradually increasing level of energy followed by a gradually decreasing level of energy to said battery and responsive to at least one of the sensed voltage and current to obtain the dynamic voltage-current characteristic loop of said battery, said dynamic voltage-current characteristic loop having a first portion produced in response to said increasing level of energy and a second portion produced in response to said decreasing level of energy, said control means being operative to determine the charge condition of said battery as a function of said dynamic voltage-current characteristic loop.

19. The apparatus of claim 18 wherein said energizing means comprises means for supplying current to said battery, and said control means controls said energizing means to supply an increasing charging current followed by a decreasing charging current to said battery.

20. The apparatus of claim 19 wherein said control means is responsive to said sensed voltage to obtain said dynamic voltage-current characteristic loop of said battery as a function of said sensed voltage and said supplied increasing and decreasing charging currents.

21. The apparatus of claim 20 wherein said means for supplying current to said battery comprises current ramp generating means, responsive to said control means, for generating a current ramp which increases with respect to time followed by a current ramp which decreases with respect to time.

22. The apparatus of claim 18 wherein said control means comprises programmed data processing means for determing said dynamic voltage-current characteristic loop of said battery as a function of the voltage sensed by said sensing means and the increasing and decreasing levels of energy supplied by said energizing means, and for determining the charge condition of said battery as a function of said voltage sensed by said sensing means when no energy is supplied to said battery.

23. The apparatus of claim 22 wherein said data processing means is programmed to detect a fault condition in said battery as a function of said voltage sensed by said sensing means.

24. The apparatus of claim 23 wherein said data processing means includes memory means for storing voltage data representing predetermined fault conditions associated with respective current levels; and said data processing means is programmed to compare the voltage at different battery current levels, as sensed by said sensing means, to said stored voltage data, and to indicate the existence of a fault condition in response to said comparison.

25. Apparatus for testing a battery comprising energizing means coupled to said battery to selectively supply current and voltage thereto; sensing means coupled to said battery to sense voltage thereacross; and data processing means programmed to control said energizing means to supply a gradually increasing current followed by a gradually decreasing current to said battery and to determine the charge condition of said battery as a function of the sensed voltage.

26. The apparatus of claim 25 wherein said data processing means is programmed to derive data representing a dynamic voltage-current characteristic loop as a function of the voltage sensed across said battery and the current supplied to said battery.

27. The apparatus of claim 26 wherein said data processing means is programmed to determine the slope of the derived dynamic voltage-current characteristic loop.

28. The apparatus of claim 27 wherein said data processing means is programmed to detect abrupt changes in the slope of the derived dynamic voltage-current characteristic loop and to provide an indication of a battery fault if said abrupt change in slope is detected at a sensed battery voltage that is less than a predetermined voltage level.

29. The apparatus of claim 28 wherein said predetermined voltage level in the gas-voltage level of said battery.

30. The apparatus of claim 27 wherein said data processing means includes memory means for storing data representing battery charge capacities correlated with different dynamic voltage-current characteristic loop slopes; and said data processing means is programmed to compare said determined slope with said stored data to obtain an indication of the charge capacity of said battery.

31. The apparatus of claim 30 wherein said memory means further stores data representing different charge levels, as a function of battery voltage, associated with each battery charge capacity; and said data processing means is programmed to compare the voltage sensed across said battery when the current supplied thereto is substantially equal to zero with said data representing different charge levels to obtain an indication of the charge level of said battery.

32. Apparatus for testing a battery comprising energizing means coupled to said battery to selectively supply current and voltage thereto; sensing means coupled to said battery to sense voltage thereacross; and data processing means including memory means for storing charge capacity data representing charge capacities of different batteries, gas voltage data representing the gas voltage levels of said batteries, charge level data representing the charge levels of said batteries as a function of the battery voltage thereof, and fault data representing predetermined battery fault conditions as a function of battery voltage; said data processing means being programmed to control said energizing means to supply a test current having gradually increasing and decreasing portions and to obtain a dynamic voltage-current characteristic as a function of said supplied current and the voltage across said battery sensed by said sensing means while said current is supplied; said data processing means being further programmed to determine the number of cells included in said battery as a function of said sensed voltage when said current is substantially zero; said data processing means being further programmed to determine the slope of said dynamic voltage-current characteristic and to derive the charge capacity of said battery as a function of the determined number of cells and determined slope; said data processing means being further programmed to compare said sensed voltage when said current is substantially zero to said stored charge level data to derive the charge level of said battery; and said data processing means being further programmed to compare said obtained dynamic voltage-current characteristic to said fault data to indicate the presence of a battery fault condition.

33. A method of testing an electrical storage battery of the type having a pair of output terminals, to obtain information relating to a fault condition of said battery, said method comprising the steps of supplying a gradually increasing charging current followed by a gradually decreasing charging current to said battery; measuring the voltage produced across said pair of output terminals of said battery in response to the charging currents supplied thereto while said charging currents are being supplied; deriving the dynamic voltage-current characteristic of said battery as a function of the measured voltage and the supplied current; comparing the measured voltage to a predetermined gas voltage level; detecting a discontinuity in the slope of said dynamic voltage-current characteristic when said measured voltage is less than said predetermined gas voltage level; and determining the existence of a fault condition in the battery under test if a discontinuity n said slope of said dynamic voltage-current characteristic is detected when said measured voltage is less than said predetermined gas voltage level.

34. Apparatus for testing a battery comprising energizing means coupled to said battery to supply energy thereto; sensing means coupled to said battery to sense voltage thereacross and current thereto; and control means coupled to said energizing means and to said sensing means for supplying an increasing level of energy followed by a gradually decreasing level of energy to said battery and responsive to said sensed voltage and supplied current to obtain the dynamic voltage-current characteristic of said battery, said control means comprising programmed data processing means for determining said dynamic voltage-current characteristic, for comparing said sensed voltage to a predetermined gas voltage level, for detecting a discontinuity in the slope of said determined dynamic voltage-current characteristic when said sensed voltage is less than said predetermined gas voltage level, and for indicating a fault condition if said discontinuity in slope is detected when said sensed voltage is less than said predetermined gas voltage level.

* * * * *